US012527090B2

(12) United States Patent
Nam et al.

(10) Patent No.: US 12,527,090 B2
(45) Date of Patent: Jan. 13, 2026

(54) DISPLAY DEVICE INCLUDING FIRST AUXILIARY ELECTRODES OVERLAPPING LIGHT-EMITTING ELEMENTS

(71) Applicant: Samsung Display Co., LTD., Yongin-si (KR)

(72) Inventors: Yuk Hyun Nam, Yongin-si (KR); Hang Jae Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 463 days.

(21) Appl. No.: 18/085,835

(22) Filed: Dec. 21, 2022

(65) Prior Publication Data

US 2023/0369345 A1 Nov. 16, 2023

(30) Foreign Application Priority Data

May 16, 2022 (KR) ........................ 10-2022-0059445

(51) Int. Cl.

| | |
|---|---|
| ***H10K 59/12*** | (2023.01) |
| ***H10D 86/40*** | (2025.01) |
| ***H10D 86/60*** | (2025.01) |
| ***H10H 29/14*** | (2025.01) |
| ***H10K 50/814*** | (2023.01) |
| ***H10K 50/824*** | (2023.01) |
| ***H10K 59/122*** | (2023.01) |
| *H10K 102/10* | (2023.01) |

(52) U.S. Cl.

CPC ........... *H10D 86/60* (2025.01); *H10D 86/441* (2025.01); *H10H 29/142* (2025.01); *H10K 50/814* (2023.02); *H10K 50/824* (2023.02); *H10K 59/122* (2023.02); *H10K 2102/103* (2023.02)

(58) Field of Classification Search

CPC .... H10D 86/441; H10D 86/60; H10K 50/814; H10K 59/122; H10K 59/824; H10K 2102/103; H10H 29/42

USPC ........................................................... 257/59

See application file for complete search history.

(56) References Cited

U.S. PATENT DOCUMENTS

2022/0109085 A1* 4/2022 Nam .................. H10H 20/8312

FOREIGN PATENT DOCUMENTS

CN 112928150 A * 6/2021 ......... H01L 27/3276
KR 10-2020-0063380 6/2020

OTHER PUBLICATIONS

Cite the machine translation Xu M (CN-112928150-A).*

* cited by examiner

*Primary Examiner* — Phuc T Dang

(74) *Attorney, Agent, or Firm* — Womble Bond Dickinson (US) LLP

(57) ABSTRACT

A display device including a substrate, first banks disposed on the substrate to be spaced apart from each other, first and second electrodes disposed on the first banks to cover the first banks and be spaced apart from each other, first auxiliary electrodes on the first electrode, and light-emitting elements disposed between the first and second electrodes, the first auxiliary electrodes overlap the light-emitting elements.

20 Claims, 23 Drawing Sheets

EL: AE, ED, CE
LA: LA1, LA2, LA3

FE: FE1, FE2
CTE_1: CTE1_1, CTE2_1

DISPLAY DEVICE INCLUDING FIRST AUXILIARY ELECTRODES OVERLAPPING LIGHT-EMITTING ELEMENTS

CROSS-REFERENCE TO RELATED APPLICATION(S)

This application claims priority to and benefits of Korean Patent Application No. 10-2022-0059445 under 35 U.S.C. § 119, filed on May 16, 2022, in the Korean Intellectual Property Office, the entire contents of which are incorporated herein by reference.

BACKGROUND

1. Technical Field

Embodiments relate to a display device.

2. Description of the Related Art

Display devices are becoming more important with developments in multimedia technology. Accordingly, various display devices such as an organic light-emitting diode (OLED) display device, a liquid crystal display (LCD) device, and the like have been used.

There are self-luminous display devices including light-emitting elements. Examples of the self-luminous display devices include an organic light-emitting display device formed of an organic material as a light-emitting material or an inorganic light emitting display device formed of an inorganic material as a light-emitting material.

SUMMARY

Embodiments provide a display device capable of addressing and resolving any contact failure that is occurred between light-emitting elements and contact electrodes by eccentricity (or misalignment).

However, embodiments of the disclosure are not limited to those set forth herein. The above and other embodiments will become more apparent to one of ordinary skill in the art to which the disclosure pertains by referencing the detailed description of the disclosure given below.

In an embodiment, a display device may include a substrate, first banks disposed on the substrate and spaced apart from each other, first and second electrodes disposed on the first banks to cover the first banks and be spaced apart from each other, first floating electrodes on the first electrode, and light-emitting elements disposed between the first and second electrodes, wherein the first auxiliary electrodes may overlap the light-emitting elements The first auxiliary electrodes may overlap end portions of the first electrode.

The display device may further include a second auxiliary electrode on the second electrode, wherein the second auxiliary electrode may overlap the light-emitting elements and an end portion of the second electrode.

The first and second auxiliary electrodes may be disposed on the same layer.

The first auxiliary electrodes and the second auxiliary electrode may include a transparent conductive material.

The transparent conductive material may include amorphous indium tin oxide (ITO), crystalline ITO, amorphous indium zinc oxide (IZO), and crystalline IZO.

The first auxiliary electrodes and the second auxiliary electrode may have a thickness of about 3 μm to about 30 μm.

The display device may further include first insulating layers disposed between the first electrode and the first auxiliary electrodes and between the second electrode and the second auxiliary electrode.

The display device may further include first contact electrodes connected to the first electrode and in contact with first end portions of the light-emitting elements.

The display device may further include a second contact electrode connected to the second electrode and in contact with second end portions of the light-emitting elements.

The first contact electrodes may be in direct contact with the first auxiliary electrodes.

The second contact electrode may be in direct contact with the second auxiliary electrode.

The first auxiliary electrodes and the second auxiliary electrode may be in direct contact with the light-emitting elements.

The display device may further include second insulating layers disposed on upper surfaces of the light-emitting elements, wherein the first contact electrodes may be in direct contact with upper surfaces of the second insulating layers.

The display device may further include third insulating layers disposed on the first contact electrodes, wherein the third insulating layers may be in direct contact with end portions of the first contact electrodes and the upper surfaces of the second insulating layers.

The second contact electrode may be in direct contact with upper surfaces of the third insulating layers.

In an embodiment, a display device may include a substrate, first banks disposed on the substrate and spaced apart from each other, first and second electrodes disposed on the first banks to cover the first banks and be spaced apart from each other in a first direction, the first and second electrodes extending in a second direction intersecting the first direction, first auxiliary electrodes extending in the second direction on the first electrode, and light-emitting elements disposed between the first and second electrodes, first contact electrodes connected to the first electrode, the first contact electrodes extending in the second direction and being in contact with first end portions of the light-emitting elements, and a second contact electrode connected to the second electrode, the second contact electrode extending in the second direction and being in contact with second end portions of the light-emitting elements, wherein the first auxiliary electrodes may overlap the first end portions of the light-emitting elements.

The first auxiliary electrodes may overlap end portions of the first electrode, and the first contact electrodes may overlap end portions of the first auxiliary electrodes in a plan view.

The display device may further include a second auxiliary electrode extending in the second direction between the second electrode and the second contact electrode.

The second auxiliary electrode may overlap an end portion of the second electrode in a plan view, and the second contact electrode may overlap an end portion of the second auxiliary electrode in a plan view.

According to the afford mentioned and other embodiments of the disclosure, any contact failure that is occurred between light-emitting elements and contact electrodes by eccentricity (or misalignment) may be addressed.

It should be noted that the effects of the disclosure are not limited to those described above, and other effects of the disclosure will be apparent from the following description.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
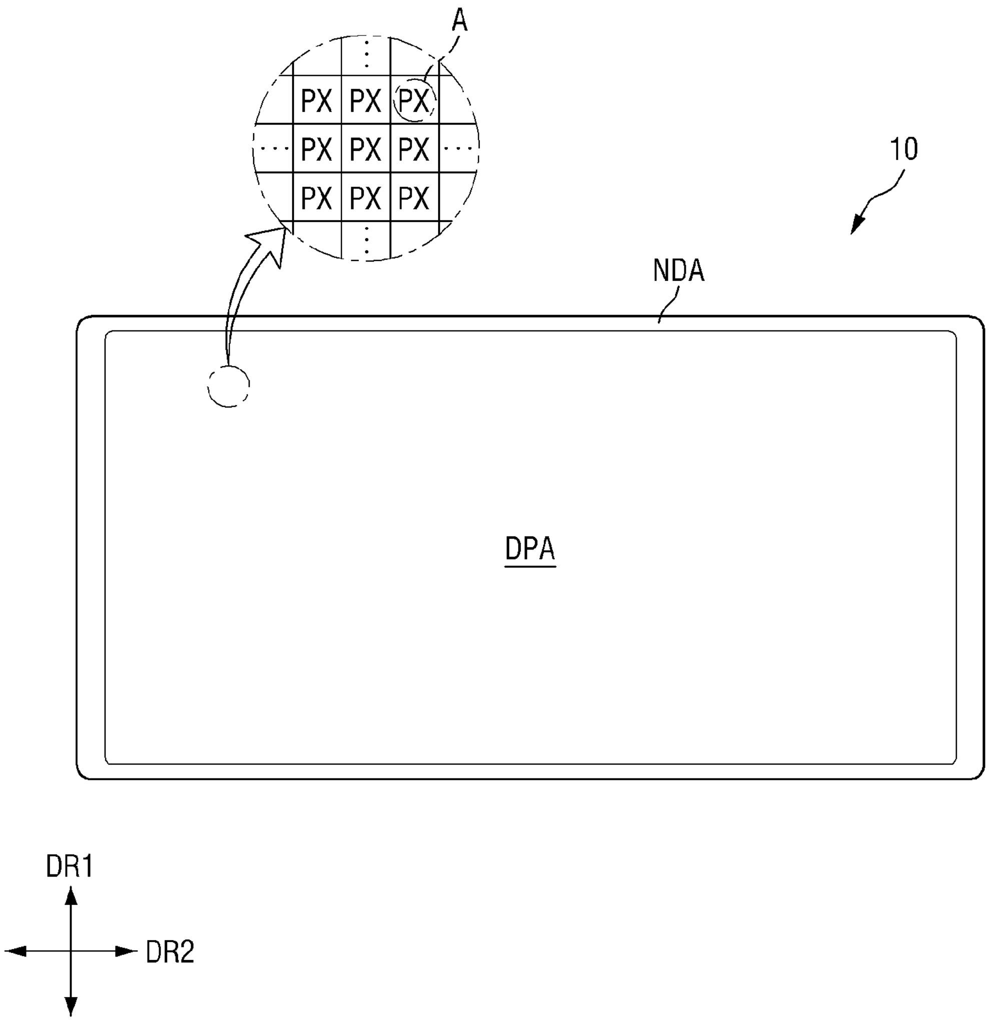
FIG. 1 is a schematic plan view of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting Hereinafter, embodiments will be described with reference to the accompanying drawings.

FIG. 1 is a schematic plan view of a display device according to an embodiment.

Referring to FIG. 1, a display device 10 may display a moving image or a still image. The display device 10 may include electronic devices that provide a display screen. Examples of the display device 10 may include a television (TV), a notebook computer, a monitor, a billboard, an Internet-of-Things (IoT) device, a mobile phone, a smartphone, a tablet personal computer (PC), an electronic watch, a smartwatch, a watchphone, a head-mounted display (HMD), a mobile communication terminal, an electronic notepad, an electronic book (e-book), a portable multimedia player (PMP), a navigation device, a gaming console, a digital camera, a camcorder, and the like.

The display device 10 may include a display panel that provides a display screen. Examples of the display panel of the display device 10 may include an inorganic light-emitting diode (LED) display panel, an organic light-emitting diode (OLED) display panel, a quantum-dot light-emitting diode (QLED) display panel, a plasma display panel (PDP), a field-emission display (FED) panel, and the like. The display panel of the display device 10 will hereinafter be described as being, for example, an ILED display panel, but embodiments are not limited thereto. For example, various other display panels are also applicable to the display panel of the display device 10.

The shape of the display device 10 may vary. For example, the display device 10 may have a rectangular shape that extends longer in a horizontal direction than in a vertical direction, a rectangular shape that extends longer in the vertical direction than in the horizontal direction, a square shape, a tetragonal shape with rounded corners, a non-tetragonal polygonal shape, or a circular shape. The shape of a display area DPA of the display device 10 may be similar to the shape of the display device 10. FIG. 1 illustrates that the display device 10 and the display area DPA both have a rectangular shape that extends in a second direction DR2.

The display device 10 may include the display area DPA and a non-display area NDA. The display area DPA may be an area in which a screen is displayed, and the non-display area NDA may be an area in which a screen is not displayed. The display area DPA may also be referred to as an active area, and the non-display area NDA may also be referred to as an inactive area. The display area DPA may occupy the middle part of the display device 10.

The display area DPA may include pixels PX. The pixels PX may be arranged in row and column directions. Each of the pixels PX may have a rectangular or square shape in a plan view, but embodiments are not limited thereto. In another example, each of the pixels PX may have a rhombus shape having sides inclined with respect to a particular direction. The pixels PX may be arranged in a stripe pattern (or shape) or an island pattern (or shape). Each of the pixels PX may include one or more light-emitting elements, which emit light of a particular wavelength range.

The non-display area NDA may be disposed around the display area DPA. The non-display area NDA may surround (e.g., entirely surround) the display area DPA or part of the display area DPA. The display area DPA may have a rectangular shape, and the non-display area NDA may be disposed adjacent to four sides of the display area DPA. The non-display area NDA may form the bezel of the display device 10. Lines or circuit drivers included in the display device 10 may be disposed in the non-display area NDA, or external devices may be mounted in the non-display area NDA.

Figure 2:
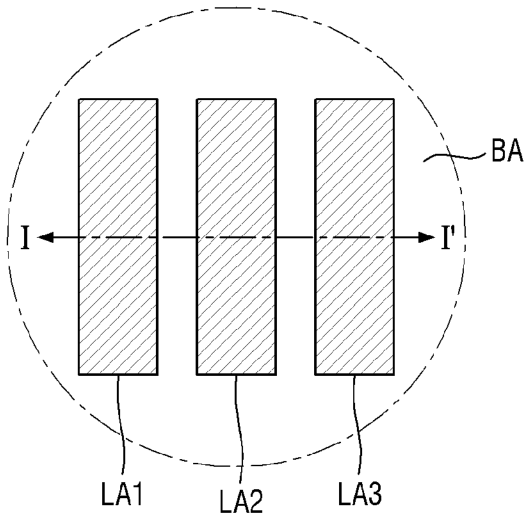
FIG. 2 is a schematic enlarged plan view of an area A of FIG. 1.

FIG. 2 is a schematic enlarged plan view of an area A of FIG. 1.

Referring to FIG. 2, a pixel PX of the display device 10 may include emission areas (e.g., LA1, LA2, and LA3), which are defined by a pixel-defining layer, and may emit light of a particular peak wavelength through the emission areas (e.g., LA1, LA2, and LA3). For example, the display area DPA of the display device 10 may include first, second, and third emission areas LA1, LA2, and LA3. The first, second, and third emission areas LA1, LA2, and LA3 may be regions that output light generated by the light-emitting elements of the display device 10 to the outside of the display device 10.

The first, second, and third emission areas LA1, LA2, and LA3 may output light having a particular peak wavelength to the outside of the display device 10. The first emission area LA1 may emit first-color light, the second emission area LA2 may emit second-color light, and the third emission area LA3 may emit third-color light. For example, the first-color light may be red light having a peak wavelength of about 610 nm to about 650 nm, the second-color light may be green light having a peak wavelength of about 510 nm to about 550 nm, and the third-color light may be blue light having a peak wavelength of about 440 nm to about 480 nm. However, embodiments are not limited to this example.

The display area DPA of the display device 10 may include a light-blocking area BA, which is positioned between the emission areas (e.g., LA1, LA2, and LA3). For example, the light-blocking area BA may surround the first, second, and third emission areas LA1, LA2, and LA3.

Figure 3:
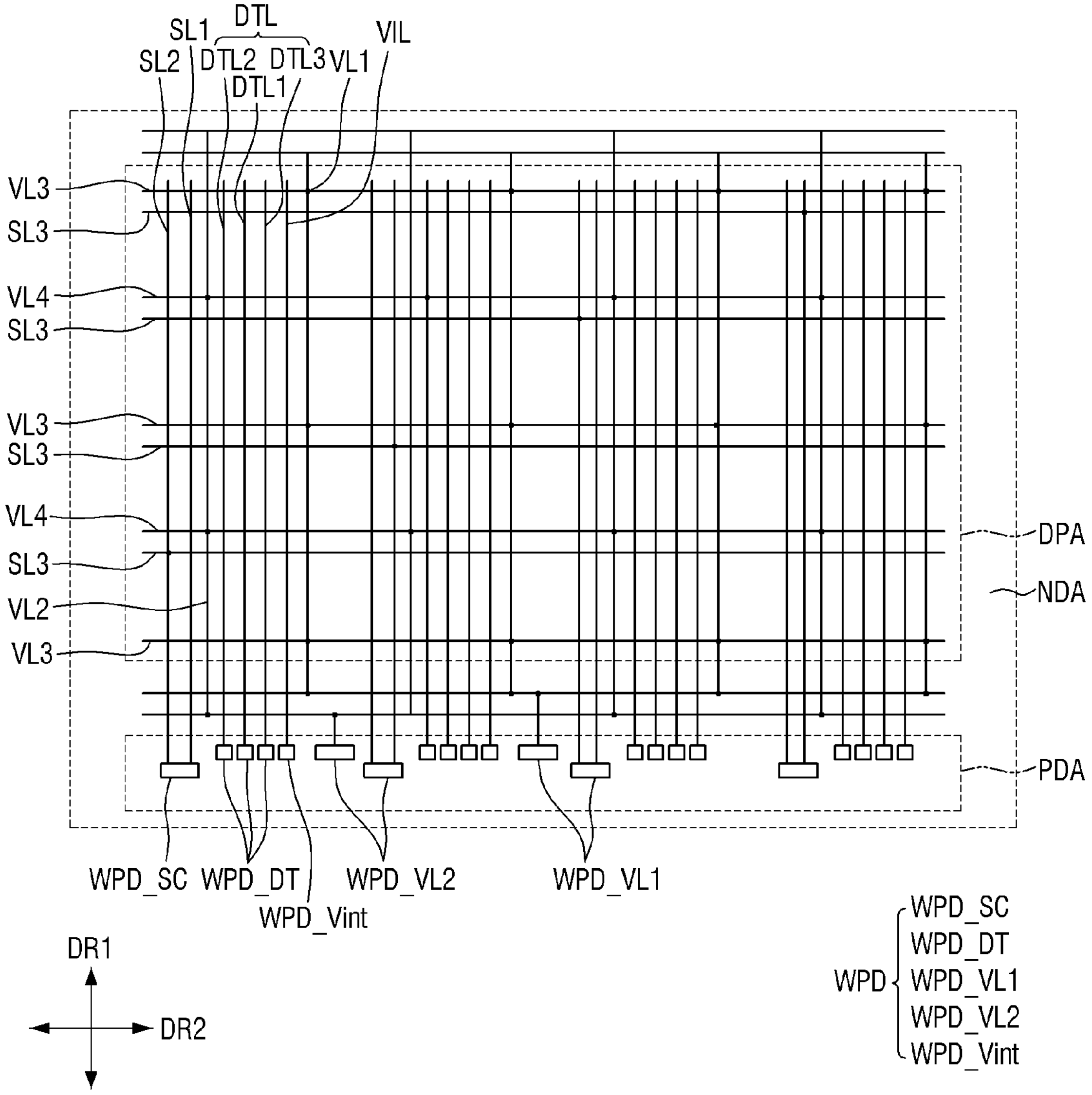
FIG. 3 is a schematic plan view illustrating the layout of lines of the display device of FIG. 1.

FIG. 3 is a schematic plan view illustrating the layout of lines of the display device of FIG. 1.

Referring to FIG. 3, the display device 10 may include lines (e.g., conductive lines, power lines, or signal lines). The display device 10 may include scan lines SL, data lines DTL, initialization voltage lines VIL, and voltage lines VL. For example, the display device 10 may further include other lines. The lines may include lines that are formed of a first conductive layer and extend in the first direction DR1 and lines that are formed of a third conductive layer and extend in the second direction DR2. However, the extension directions of the lines are not limited thereto.

First scan lines SL1 and second scan lines SL2 may extend in the first direction DR1. A set of first and second scan lines SL1 and SL2 may be disposed adjacent to each other and may be spaced apart from other sets of first and second scan lines SL1 and SL2 in the second direction DR2. The first scan lines SL1 and the second scan lines SL2 may be connected (e.g., electrically connected) to scan line wire pads WPD_SC, which are connected to a scan driver (not illustrated). The first scan lines SL1 and the second scan lines SL2 may extend from a pad area PDA in the non-display area NDA to the display area DPA.

Third scan lines SL3 may extend in the second direction DR2 and may be spaced apart from one another in the first direction DR1. Each of the third scan lines SL3 may be connected (e.g., electrically connected) to one or more first scan lines SL1 or one or more second scan lines SL2. The scan lines SL may form a mesh structure over the entire display area DPA, but embodiments are not limited thereto.

The data lines DTL may extend in the first direction DR1. The data lines DTL may include first data lines DTL1, second data lines DTL2, and third data lines DTL3, and one first data line DTL1, one second data line DTL2, and one third data line DTL3 may be paired together to be disposed adjacent to one another. The data lines DTL may extend from the pad area PDA in the non-display area NDA to the display area DPA. However, embodiments are not limited thereto. In another example, the data lines DTL may be arranged at equal intervals (or distances) between first voltage lines VL1 and second voltage lines VL2.

The initialization voltage lines VIL may extend in the first direction DR1. The initialization voltage lines VIL may be disposed between the data lines DTL and the first voltage lines VL1. The initialization voltage lines VIL may extend from the pad area PDA in the non-display area NDA to the display area DPA.

The first voltage lines VL1 and the second voltage lines VL2 may extend in the first direction DR1, and third voltage lines VL3 and fourth voltage lines VL4 may extend in the second direction DR2. The first voltage lines VL1 and the second voltage lines VL2 may be alternately arranged in the second direction DR2, and the third voltage lines VL3 and the fourth voltage lines VL4 may be alternately arranged in the first direction DR1. The first voltage lines VL1 and the second voltage lines VL2 may extend in the first direction DR1 across the display area DPA. Some of the third voltage lines VL3 and some of the fourth voltage lines VL4 may be disposed in the display area DPA, and the other third voltage lines VL3 and the other fourth voltage lines VL4 may be disposed in the non-display area NDA where is adjacent to sides (e.g., opposite sides) of the display area DPA in the first direction DR1. The first voltage lines VL1 and the second voltage lines VL2 may be formed of the first conductive layer, and the third voltage lines VL3 and the fourth voltage lines VL4 may be formed of the third conductive layer, which is disposed in a different layer from the first conductive layer. Each of the first voltage lines VL1 may be connected (e.g., electrically connected) to one or more third voltage lines VL3, and the second voltage lines VL2, and the voltage lines VL may form a mesh structure over the entire display area DPA, but embodiments are not limited thereto.

Each of the first scan lines SL1, the second scan lines SL2, the data lines DTL, the initialization voltage lines VIL, the first voltage lines VL1, and the second voltage lines VL2 may be connected (e.g., electrically connected) to one or more wire pads WPD. The wire pads WPD may be disposed in the non-display area NDA. The wire pads WPD may also be disposed in the pad area PDA on a second side, in the first direction DR1, of the display area DPA, e.g., on the lower side of the display area DPA. The first scan lines SL1 and the second scan lines SL2 may be connected (e.g., electrically connected) to the scan line wire pads WPD_SC, and the data lines DTL may be connected (e.g., electrically connected) to different data line wire pads WPD_DT. The initialization voltage lines VIL may be connected (e.g., electrically connected) to initialization line wire pads WPD_Vint, the first voltage lines VL1 may be connected (e.g., electrically connected) to first voltage line wire pads WPD_VL1, and the second voltage lines VL2 may be connected (e.g., electrically connected) to second voltage line wire pads WPD_VL2. External devices may be mounted on the wire pads WPD. The external devices may be mounted on the wire pads WPD via anisotropic conductive films or ultrasonic bonding. The wire pads WPD are illustrated as being disposed in the pad area PDA on the lower side of the display area DPA, but embodiments are not limited thereto. In another example, some of the wire pads WPD may be disposed on the upper side of the display area DPA or on the left or right side of the display area DPA.

A pixel PX or a subpixel SPXn (where n is an integer of 1 to 3) of the display device 10 may include a pixel driving circuit. The above-described lines of the display device 10 may apply driving signals to the pixel driving circuit, passing by the pixel or the subpixel SPXn. The pixel driving circuit may include transistors and capacitors. The numbers of transistors and capacitors included in the pixel driving circuit may vary. For example, the pixel driving circuit may have a "3T-1C" structure including three transistors and one capacitor. The pixel driving circuit will hereinafter be described as having the "3T-1C" structure, but embodiments are not limited thereto. In another example, various other structures such as a "2T-1C", "7T-1C", or "6T-1C" structure may also be applicable to the pixel driving circuit.

Figure 4:
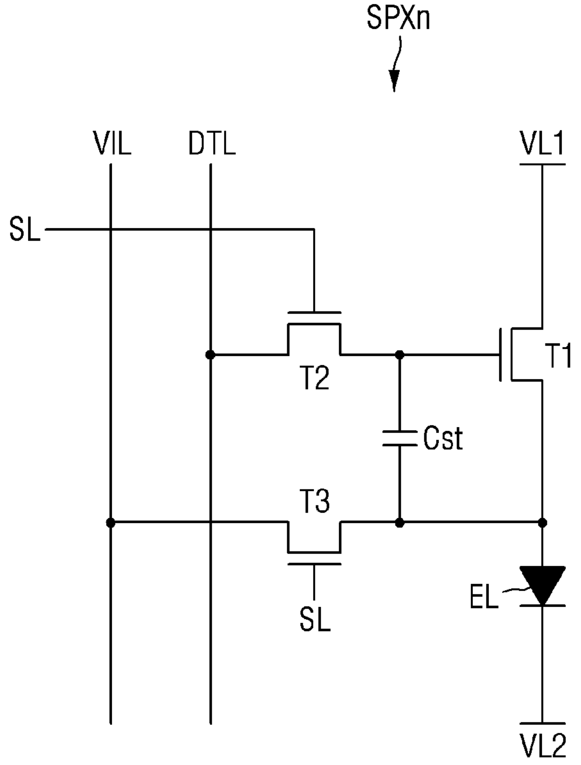
FIGS. 4 and 5 are schematic diagrams of equivalent circuits of pixel circuits of the display device of FIG. 1.
Figure 5:
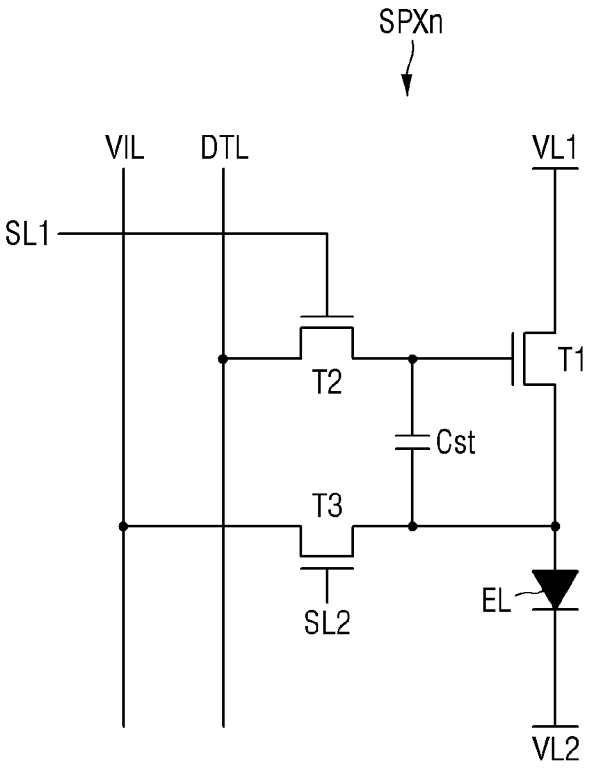

FIGS. 4 and 5 are schematic diagrams of equivalent circuits of pixel circuits of the display device of FIG. 1.

Referring to FIG. 4, a subpixel SPXn of the display device 10 may include a light-emitting diode ("LED") EL, three transistors, i.e., first through third transistors T1 through T3, and one storage capacitor Cst.

The LED EL may emit light in accordance with a current applied thereto via the first transistor T1. The LED EL may include a first electrode, a second electrode, and at least one light-emitting element disposed between the first and second electrodes. The light-emitting element may emit light of a particular wavelength range in accordance with electric signals transmitted thereto from the first and second electrodes.

A first end portion of the LED EL may be connected (e.g., electrically connected) to the source electrode of the first transistor T1, and a second end portion of the LED EL may be connected (e.g., electrically connected) to a second voltage line VL2, to which a low-potential voltage (hereinafter, a second power supply voltage) is supplied. For example, the second power supply voltage may be lower than a high-potential voltage (hereinafter, a first power supply voltage), which is supplied to a first voltage line VL1.

The first transistor T1 may control a current flowing from the first voltage line VL1, to which the first power supply voltage is supplied, to the LED EL in accordance with the difference in voltage between the gate electrode and the source electrode of the first transistor T1. For example, the first transistor T1 may be a transistor for driving the LED EL. The gate electrode of the first transistor T1 may be connected (e.g., electrically connected) to the source electrode of the second transistor T2, the source electrode of the first transistor T1 may be connected (e.g., electrically connected) to the first electrode of the LED EL, and the drain electrode of the first transistor T1 may be connected (e.g., electrically connected) to the first voltage line VL1, to which the first power supply voltage is supplied.

The second transistor T2 may be turned on by a scan signal from a first scan line SL1 to connect (e.g., electrically connect) a data line DTL to the gate electrode of the first transistor T1. The gate electrode of the second transistor T2 may be connected (e.g., electrically connected) to the first scan line SL1, the source electrode of the second transistor T2 may be connected (e.g., electrically connected) to the gate electrode of the first transistor T1, and the drain electrode of the second transistor T2 may be connected (e.g., electrically connected) to the data line DTL.

The third transistor T3 may be turned on by a second scan signal from a second scan line SL2 to connect (e.g., electrically connect) an initialization voltage line VIL to a first end portion of the LED EL. The gate electrode of the third transistor T3 may be connected (e.g., electrically connected) to the second scan line SL2, the drain electrode of the third transistor T3 may be connected (e.g., electrically connected) to the initialization voltage line VIL, and the source electrode of the third transistor T3 may be connected (e.g., electrically connected) to the first end portion of the LED EL or the source electrode of the first transistor T1.

The source electrodes and the drain electrodes of the first through third transistors T1 through T3 are not limited to the above descriptions. The first through third transistors T1 through T3 may be formed as thin-film transistors (TFTs). FIG. 4 illustrates that the first through third transistors T1 through T3 are formed as N-type metal-oxide semiconductor field-effect transistors (MOSFETs), but embodiments are not limited thereto. In another example, the first through third transistors T1 through T3 may be formed as P-type MOSFETs. In another example, some of the first through third transistors T1 through T3 may be formed as N-type MOSFETS, and the other transistor(s) may be formed as P-type MOSFETs.

The storage capacitor Cst may be formed between the gate electrode and the source electrode of the first transistor T1. The storage capacitor Cst may store a differential voltage corresponding to the difference in voltage between the gate electrode and the source electrode of the first transistor T1.

Referring to FIG. 4, the gate electrode of the second transistor T2 may be connected (e.g., electrically connected) to the first scan line SL1, and the gate electrode of the third transistor T3 may be connected (e.g., electrically connected) to the second scan line SL2. The first and second scan lines SL1 and SL2 may be different scan lines, and the second and third transistors T2 and T3 may be turned on by scan signals from different scan lines. However, embodiments are not limited thereto.

Referring to FIG. 5, the gate electrodes of second and third transistors T2 and T3 may be connected (e.g., electrically connected) to the same scan line SL. The second and third transistors T2 and T3 may be turned on at the same time by a scan signal from the same scan line.

Figure 6:
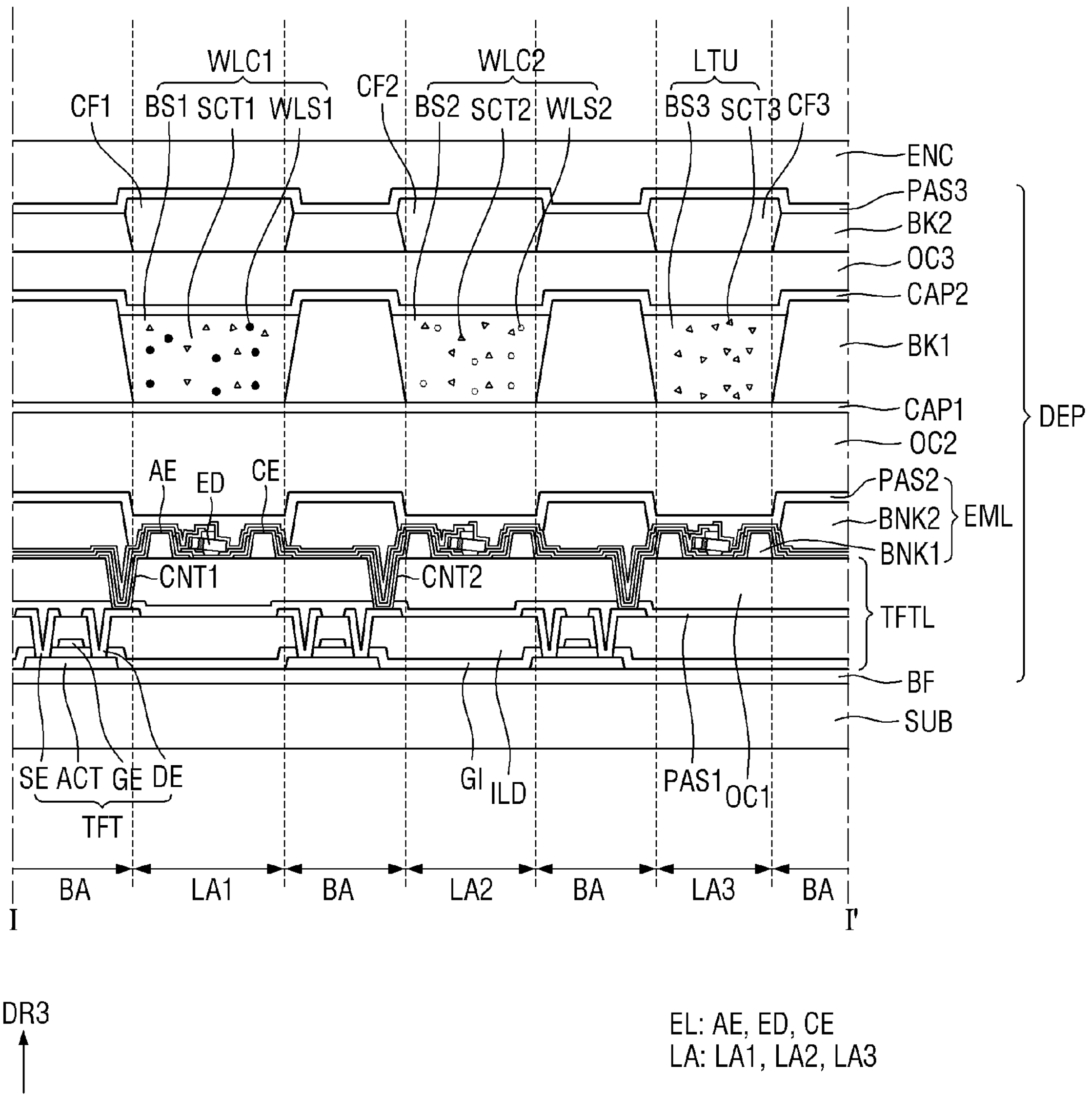
FIG. 6 is a schematic cross-sectional view taken along line I-I' of FIG. 2.

FIG. 6 is a schematic cross-sectional view taken along line I-I' of FIG. 2.

Referring to FIG. 6, the display device 10 may include a substrate SUB, which is disposed in both the display area DPA and the non-display area NDA, a display element layer DEP, which is disposed on part of the substrate SUB in the display area DPA, and an encapsulation member ENC, which is disposed in both the display area DPA and the non-display area NDA and seals the display element layer DEP.

The substrate SUB may be formed of an insulating material such as a polymer resin. The insulating material may include, for example, polyimide (PI), but embodiments are not limited thereto.

The display element layer DEP may include a buffer layer BF, a thin-film transistor (TFT) layer TFTL, a light-emitting element layer EML, a second planarization layer OC2, a first capping layer CAP1, first light-blocking members BK1, a first wavelength conversion part WLC1, a second wavelength conversion part WLC2, a light-transmitting part LTU, a second capping layer CAP2, a third planarization layer OC3, second light-blocking members BK2, first, second, and third color filters CF1, CF2, and CF3, a third passivation layer PAS3, and the encapsulation member ENC.

The buffer layer BF may be disposed on the substrate 100. The buffer layer BF may be formed as an inorganic layer capable of preventing the penetration of the air or moisture.

The TFT layer TFTL may include TFTs "TFT", a gate insulating layer GI, an interlayer insulating layer ILD, a first passivation layer PAS1, and a first planarization layer OC1.

The TFTs "TFT" may be disposed on the buffer layer BF and may form the pixel circuit of each pixel PX.

Semiconductor layers ACT may be disposed on the buffer layer BF. The semiconductor layers ACT may overlap gate electrodes GE, source electrodes SE, and drain electrodes DE. The semiconductor layers ACT may be in contact with (e.g., in direct contact with) the source electrodes SE and the drain electrodes DE and may face the gate electrodes GE with the gate insulating layer GI disposed between the semiconductor layers ACT and the the gate electrodes GE.

The gate electrodes GE may be disposed on the gate insulating layer GI. The gate electrodes GE may overlap the semiconductor layers ACT with the gate insulating layer GI disposed between the semiconductor layers ACT and the gate electrodes GE.

The source electrodes SE and the drain electrodes DE may be disposed on the interlayer insulating layer ILD to be spaced apart from one another. The source electrodes SE may be in contact with end portions of the semiconductor layers ACT through contact holes formed in the gate insulating layer GI and the interlayer insulating layer ILD. The drain electrodes DE may be in contact with the other end portions of the semiconductor layers ACT through contact holes formed in the gate insulating layer GI and the interlayer insulating layer ILD. The drain electrodes DE may be connected (e.g., electrically connected) to first electrodes AE of light-emitting members EL through contact holes formed in the first passivation layer PAS1 and the first planarization layer OC1.

The gate insulating layer GI may be disposed on the semiconductor layers ACT. For example, the gate insulating layer GI may be disposed on the semiconductor layers ACT and the buffer layer BF and may insulate the semiconductor layers ACT and the buffer layer BF from one another. The gate insulating layer GI may include contact holes penetrated by the source electrodes SE and contact holes penetrated by the drain electrodes DE.

The interlayer insulating layer ILD may be disposed on the gate electrodes GE. For example, the interlayer insulating layer ILD may include contact holes penetrated by the source electrodes SE and contact holes penetrated by the drain electrodes DE.

The first passivation layer PAS1 may be disposed on the TFTs “TFT” to protect the TFTs “TFT”. For example, the first passivation layer PAS1 may include contact holes penetrated by the first electrodes AE of the light-emitting members EL.

The first planarization layer OC1 may be formed on the first passivation layer PAS1 to planarize the top surfaces (or upper surfaces) of the TFTs “TFT”. For example, the first planarization layer OC1 may include contact holes penetrated by the first electrodes AE of the light-emitting members EL.

The light-emitting element layer EML may include the light-emitting members EL, first banks BNK1, second banks BNK2, first insulating layers RMPS, and a second passivation layer PAS2.

The light-emitting members EL may be formed on the TFTs “TFT”. The light-emitting members EL may include the first electrodes AE, second electrodes CE, and light-emitting elements ED.

The first electrodes AE may be formed on the first planarization layer OC1. For example, the first electrodes AE may be disposed on the first banks BNK1 on the first planarization layer OC1 to cover the first banks BNK1. The first electrodes AE may be disposed to overlap the first, second, and third emission areas LA1, LA2, and LA3, which are defined by the second banks BNK2. The first electrodes AE may be connected (e.g., electrically connected) to the drain electrodes DE of the TFTs “TFT”.

The second electrodes CE may be formed on the first planarization layer OC1. For example, the second electrodes CE may be disposed on the first banks BNK1 on the first planarization layer OC1 to cover the first banks BNK1. The second electrodes CE may be disposed to overlap the first, second, and third emission areas LA1, LA2, and LA3, which are defined by the second banks BNK2. For example, the second electrodes CE may receive a common voltage provided to all pixels PX.

The first insulating layers RMPS may cover parts of the first electrodes AE and parts of the second electrodes CE and may insulate the first electrodes AE and the second electrodes CE from one another.

The light-emitting elements ED may be disposed on the first planarization layer OC1, between the first electrodes AE and the second electrodes CE. The light-emitting elements ED may be disposed on the first insulating layers RMPS. First end portions of the light-emitting elements ED may be connected (e.g., electrically connected) to the first electrodes AE, and second end portions of the light-emitting elements ED may be connected (e.g., electrically connected) to the second electrodes CE. For example, the light-emitting elements ED may include active layers having the same material and may thus emit light of the same wavelength band or the same color. Light emitted by the first, second, and third emission areas LA1, LA2, and LA3 may have the same color. For example, the light-emitting elements ED may emit third-color light having a peak wavelength of about 440 nm to about 480 nm or blue light.

The second banks BNK2 may be disposed on the first planarization layer OC1 to define the first, second, and third emission areas LA1, LA2, and LA3. For example, the second banks BNK2 may surround the first, second, and third emission areas LA1, LA2, and LA3, but embodiments are not limited thereto. The second banks BNK2 may be disposed in the light-blocking area BA.

The second passivation layer PAS2 may be disposed on the light-emitting members EL and the second banks BNK2. The second passivation layer PAS2 may cover and protect the light-emitting members EL.

The display device 10 may further include the second planarization layer OC2, the first capping layer CAP1, the first wavelength conversion part WLC1, the second wavelength conversion part WLC2, the light-transmitting part LTU, the second capping layer CAP2, the third planarization layer OC3, the second light-blocking members BK2, the first, second, and third color filters CF1, CF2, and CF3, the third passivation layer PAS3, and the encapsulation member ENC.

The second planarization layer OC2 may be formed on the light-emitting element layer EML to planarize the top surface (or upper surface) of the light-emitting element layer EML. The second planarization layer OC2 may include an organic material.

The first capping layer CAP1 may be disposed on the second planarization layer OC2. The first capping layer CAP1 may seal the bottom surfaces of the first and second wavelength conversion parts WLC1 and WLC2 and the light-transmitting part LTU. The first capping layer CAP1 may include an inorganic material.

The first light-blocking members BK1 may be disposed on the first capping layer CAP1 in the light-blocking area BA. The first light-blocking members BK1 may overlap the second banks BNK2 in a thickness direction (e.g., the third direction DR3). The first light-blocking members BK1 may block the transmission of light.

The first light-blocking members BK1 may include an organic light-blocking material and a liquid repellent component.

The first light-blocking members BK1 may include the liquid repellent component and may separate the first and second wavelength conversion parts WLC1 and WLC2 and the light-transmitting part LTU to define their respective emission areas LA (e.g., LA1, LA2, and LA3).

The first wavelength conversion part WLC1 may be disposed on the first capping layer CAP1 in the first emission area LA1. The first wavelength conversion part WLC1 may be surrounded by the first light-blocking members BK1. The first wavelength conversion part WLC1 may include a first base resin BS1, a first scatterer SCT1, and a first wavelength shifter WLS1.

The first base resin BS1 may include a material having a relatively high light transmittance. The first base resin BS1 may be formed of a transparent organic material. For example, the first base resin BS1 may include at least one organic material, e.g., an epoxy resin, an acrylic resin, a cardo resin, and an imide resin.

The first scatterer SCT1 may have a different refractive index from the first base resin BS1 and may form an optical interface with the first base resin BS1.

The first wavelength shifter WLS1 may convert or shift the peak wavelength of incident light into a first peak wavelength. For example, the first wavelength shifter WLS1 may convert blue light provided by the display device 10 into red light having a single peak wavelength of about 610 nm to about 650 nm. The first wavelength shifter WLS1 may include quantum dots, quantum rods, or a phosphor. The quantum dots may be a particulate material capable of emitting light of a particular color in response to the transition of electrons from a conduction band to a valence band.

Light emitted by the first wavelength shifter WLS1 may have a full width at half maximum (FWHM) of about 45 nm or less, about 40 nm or less, or about 30 nm or less and may further improve the color purity and color reproducibility of colors displayed by the display device 10.

Some of blue light provided from the light-emitting element layer EML may not be converted into red light by the first wavelength shifter WLS1, but may transmit through the first wavelength conversion part WLC1. The blue light that is not wavelength-converted by the first wavelength conversion part WLC1, but incident upon the first color filter CF1 may be blocked by the first color filter CF1. Red light converted from blue light by the first wavelength conversion part WLC1 may be emitted to the outside of the display device 10 through the first color filter CF1. Accordingly, the first emission area LA1 may emit red light.

The second wavelength conversion part WLC2 may be disposed on the first capping layer CAP1 in the second emission area LA2. The second wavelength conversion part WLC2 may be surrounded by the first light-blocking members BK1. The second wavelength conversion part WLC2 may include a second base resin BS2, a second scatterer SCT2, and a second wavelength shifter WLS2.

The second base resin BS2 may include a material having a relatively high light transmittance. The second base resin BS2 may be formed of a transparent organic material.

The second scatterer SCT2 may have a different refractive index from the second base resin BS2 and may form an optical interface with the second base resin BS2. For example, the second scatterer SCT2 may include a light-scattering material or light-scattering particles capable of scattering at least some light.

The second wavelength shifter WLS2 may convert or shift the peak wavelength of incident light into a second peak wavelength, which is different from the first peak wavelength. For example, the second wavelength shifter WLS2 may convert blue light provided by the display device 10 into green light having a single peak wavelength of about 510 nm to about 550 nm. The second wavelength shifter WLS2 may include quantum dots, quantum rods, or a phosphor. The second wavelength shifter WLS2 may include the same material as the first wavelength shifter WLS1.

The light-transmitting part LTU may be disposed on the first capping layer CAP1 in the third emission area LA3. The light-transmitting part LTU may be surrounded by the first light-blocking members BK1. The light-transmitting part LTU may transmit incident light therethrough with maintaining the peak wavelength of the incident light. The light-transmitting part LTU may include a third base resin BS3 and a third scatterer SCT3.

The third base resin BS3 may include a material having a relatively high light transmittance. The third base resin BS3 may be formed of a transparent organic material.

The third scatterer SCT3 may have a different refractive index from the third base resin BS3 and may form an optical interface with the third base resin BS3. For example, the third scatterer SCT3 may include a light-scattering material or light-scattering particles capable of scattering at least some light.

As the first and second wavelength conversion parts WLC1 and WLC2 and the light-transmitting part LTU are disposed on the light-emitting element layer EML through the second planarization layer OC2 and the first capping layer CAP1, the display device 10 may not require a separate substrate for the first and second wavelength conversion parts WLC1 and WLC2 and the light-transmitting part LTU.

The second capping layer CAP2 may cover the first and second wavelength conversion parts WLC1 and WLC2, the light-transmitting part LTU, and the first light-blocking members BK1.

The third planarization layer OC3 may be disposed on the second capping layer CAP2 to planarize the top surfaces (or upper surfaces) of the first and second wavelength conversion parts WLC1 and WLC2 and the light-transmitting part LTU. The third planarization layer OC3 may include an organic material.

The second light-blocking members BK2 may be disposed on the third planarization layer OC3 in the light-blocking area BA. The second light-blocking members BK2 may overlap the first light-blocking members BK1 or the second banks BNK2 in the thickness direction (e.g., the third direction DR3). The second light-blocking members BK2 may block the transmission of light.

The first color filter CF1 may be disposed on the third planarization layer OC3 in the first emission area LA1. The first color filter CF1 may be surrounded by the second light-blocking members BK2. The first color filter CF1 may overlap the first wavelength conversion part WLC1 in the thickness direction (e.g., a third direction DR3). The first color filter CF1 may selectively transmit first-color light (e.g., red light) therethrough and may block or absorb second-color light (e.g., green light) and third-color light (e.g., blue light).

The second color filter CF2 may be disposed on the third planarization layer OC3 in the second emission area LA2. The second color filter CF2 may be surrounded by the second light-blocking members BK2. The second color filter CF2 may overlap the second wavelength conversion part WLC2 in the thickness direction (e.g., the third direction DR3). The second color filter CF2 may selectively transmit second-color light (e.g., green light) therethrough and may block or absorb first-color light (e.g., red light) and third-color light (e.g., blue light).

The third color filter CF3 may be disposed on the third planarization layer OC3 in the third emission area LA3. The third color filter CF3 may be surrounded by the second light-blocking members BK2. The third color filter CF3 may overlap the light-transmitting part LTU. The third color filter CF3 may selectively transmit third-color light (e.g., blue light) therethrough and may block or absorb first-color light (e.g., red light) and second-color light (e.g., green light).

The first, second, and third color filters CF1, CF2, and CF3 may reduce reflected light from external light from the outside of the display device 10 by absorbing some of the external light. Accordingly, the first, second, and third color filters CF1, CF2, and CF3 may prevent any color distortions that is occurred by the reflection of external light.

The third passivation layer PAS3 may cover the first, second, and third color filters CF1, CF2, and CF3. The third passivation layer PAS3 may protect the first, second, and third color filters CF1, CF2, and CF3.

The encapsulation member ENC may be disposed on the third passivation layer PASS. For example, the encapsulation member ENC may include at least one inorganic layer and may prevent the penetration of oxygen or moisture. For example, the encapsulation member ENC may include at least one organic layer and may protect the display device 10 from a foreign material such as dust.

Figure 7:
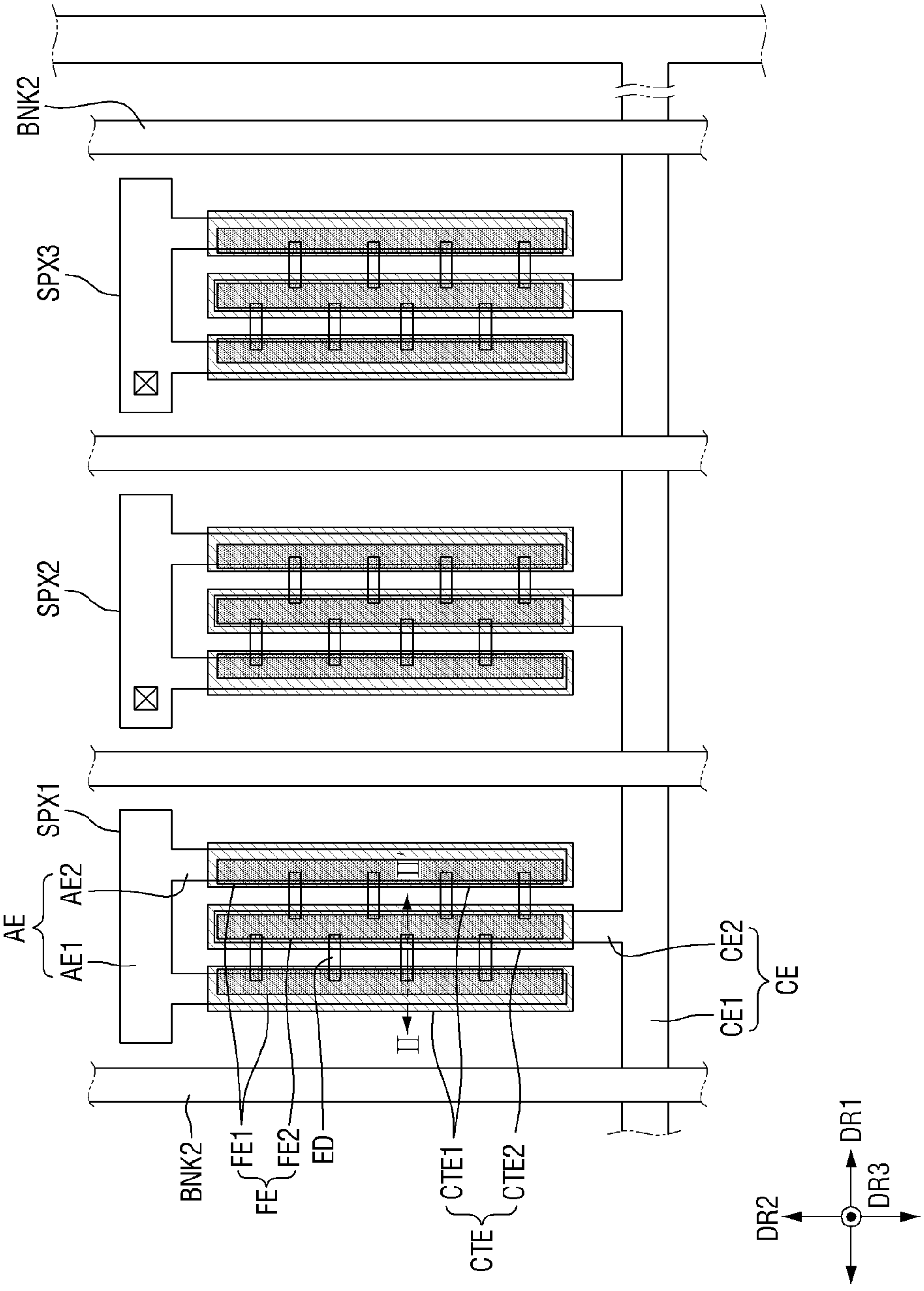
FIG. 7 is a schematic plan view of a pixel of the display device of FIG. 1.
Figure 8:
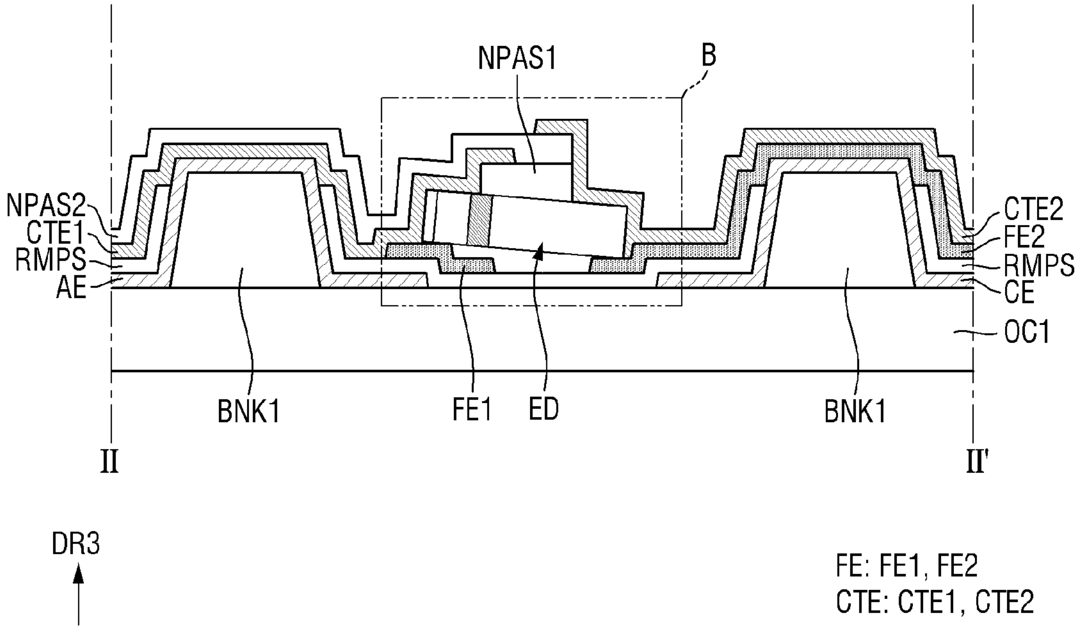
FIG. 8 is a schematic cross-sectional view taken along line II-IF of FIG. 7.
Figure 9:
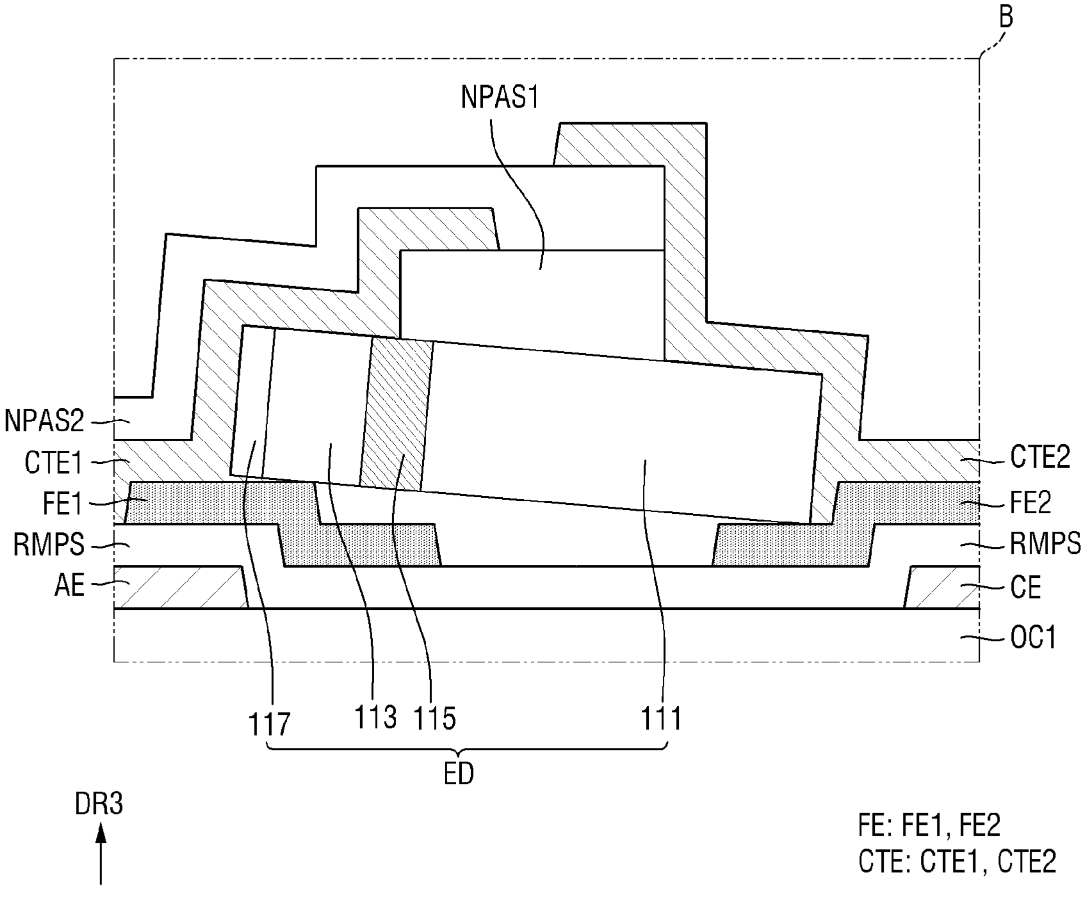
FIG. 9 is a schematic cross-sectional view of an area B of FIG. 8.

FIG. 7 is a schematic plan view of a pixel of the display device of FIG. 1. FIG. 8 is a schematic cross-sectional view taken along line II-IF of FIG. 7. FIG. 9 is a schematic cross-sectional view of an area B of FIG. 8.

Referring to FIGS. 7 through 9 and further to FIG. 6, first, second, and third subpixels SPX1, SPX2, and SPX3 of a pixel PX may emit light of the same color. For example, the first, second, and third subpixels SPX1, SPX2, and SPX3 may include the same set of light-emitting elements ED and may all emit third-color light or blue light. In another example, the first subpixel SPX1 may emit first-color light or red light, the second subpixel SPX2 may emit second-color light or green light, and the third subpixel SPX3 may emit third-color light or blue light.

Each of the first, second, and third subpixels SPX1, SPX2, and SPX3 may include first and second electrodes AE and CE, light-emitting elements ED, contact electrodes CTE, and second banks BNK2.

The first and second electrodes AE and CE may be connected (e.g., electrically connected) to the light-emitting elements ED and may receive certain voltages, and the light-emitting elements ED may emit light of a particular wavelength band. At least parts of the first and second electrodes AE and CE may generate an electric field in the pixel PX, and the light-emitting elements ED may be aligned by the electric field.

For example, the first electrode AE may be a pixel electrode separate for each of the first, second, and third subpixels SPX1, SPX2, and SPX3, and the second electrode CE may be a common electrode connected in common between the first, second, and third subpixels SPX1, SPX2, and SPX3. One of the first and second electrodes AE and CE may be the anodes of the light-emitting elements ED, and the other electrode may be the cathodes of the light-emitting elements ED.

The first electrode AE may include a first electrode stem AE1, which extends in the first direction DR1, and one or more first electrode branches AE2, which branch off of the first electrode stem AE1 to extend in the second direction DR2.

The first electrode stems AE1 of the first, second, and third subpixels SPX1, SPX2, and SPX3, which are adjacent to one another in the first direction DR1 may be spaced apart from each other and may be disposed on an imaginary extension line from one another. The first electrode stems AE1 of the first, second, and third subpixels SPX1, SPX2, and SPX3 may receive different signals and may be driven independently.

In each of the first, second, and third subpixels SPX1, SPX2, and SPX3, the first electrode branches AE2 may branch of the first electrode stem AE1 to extend in the second direction DR2. In each of the first, second, and third subpixels SPX1, SPX2, and SPX3, first end portions of the first electrode branches AE2 may be connected (e.g., electrically connected) to the first electrode stem AE1, and second end portions of the first electrode branches AE2 may be spaced apart from a second electrode stem CE1, which is opposite to the first electrode stem AE1.

The second electrode CE of each of the first, second, and third subpixels SPX1, SPX2, and SPX3 may include the second electrode stem CE1, which extends in the first direction DR1, and a second electrode branch CE2, which is a branch of the second electrode stem CE1 and extends in the second direction DR2. The second electrode stems CE1 of the first, second, and third subpixels SPX1, SPX2, and SPX3 may be connected (e.g., electrically connected) to one another. A second electrode stem CE1 may extend in the first direction DR1 across multiple pixels PX. A second electrode stem CE1 may be connected (e.g., electrically connected) to an outer part of the display area DA or part of the non-display area NDA that extends in a direction.

In each of the first, second, and third subpixels SPX1, SPX2, and SPX3, the second electrode branch CE2 may be spaced apart from the first electrode branch AE2 and may face the first electrode branch AE2, a first end portion of the second electrode branch CE2 may be connected (e.g., electrically connected) to the second electrode stem CE1, and a second end portion of the second electrode branch CE2 may be spaced apart from the first electrode stem AE1.

In each of the first, second, and third subpixels SPX1, SPX2, and SPX3, the first electrode AE may be connected (e.g., electrically connected) to the TFT layer TFTL through a first contact hole CNT1, and the second electrode CE may be connected (e.g., electrically connected) to the TFT layer TFTL through a second contact hole CNT2. For example, in each of the first, second, and third subpixels SPX1, SPX2, and SPX3, the first and second contact holes CNT1 and CNT2 may be disposed in the first and second electrode stems AE1 and CE1, respectively, but embodiments are not limited thereto.

The second banks BNK2 may be disposed along the boundary areas between the first, second, and third subpixels SPX1, SPX2, and SPX3. The first electrode stems AE1 of the first, second, and third subpixels SPX1, SPX2, and SPX3 may be spaced apart from one another by the second banks BNK2. The second banks BNK2 may extend in the second direction DR2 and may be disposed along the boundary areas between pixels (PX) that are arranged along the first direction DR1. The second banks BNK2 may also be disposed along the boundary areas between pixels (PX) that are arranged along the second direction DR2. The second banks BNK2 may define the boundary areas of each pixel (PX).

The second banks BNK2 may prevent ink, which includes the light-emitting elements ED dispersed therein, from spilling (overflowing) over between neighboring pixels PX in the fabrication of the display device 10. The second banks BNK2 may separate ink having different sets of light-emitting elements ED dispersed therein not to be mixed together.

In each of the first, second, and third subpixels SPX1, SPX2, and SPX3, the light-emitting elements ED may be disposed between the first and second electrodes AE and CE. In each of the first, second, and third subpixels SPX1, SPX2, and SPX3, the first end portions of the light-emitting elements ED may be connected (e.g., electrically connected) to the first electrode AE, and the second end portions of the light-emitting elements ED may be connected (e.g., electrically connected) to the second electrode CE.

The light-emitting elements ED may be disposed to be spaced apart from one another, substantially in parallel to one another. The distance between the light-emitting elements ED is not limited.

The light-emitting elements ED of each of the first, second, and third subpixels SPX1, SPX2, and SPX3 may include active layers formed of the same material and may thus emit light of the same wavelength band or the same color. The first, second, and third subpixels SPX1, SPX2, and SPX3 may emit light of the same color. For example, the light-emitting elements of each of the first, second, and third subpixels SPX1, SPX2, and SPX3 may emit third-color light having a peak wavelength of about 440 nm to about 480 nm or blue light.

The contact electrodes CTE of each of the first, second, and third subpixels SPX1, SPX2, and SPX3 may include first contact electrodes CTE1 and a second contact electrode CTE2. In each of the first, second, and third subpixels SPX1, SPX2, and SPX3, the first contact electrodes CTE1 may cover and may connect (e.g., electrically connect) the first electrode branches AE2 and some of the light-emitting elements ED. In each of the first, second, and third subpixels SPX1, SPX2, and SPX3, the second contact electrode CTE2 may cover and may connect (e.g., electrically connect) the second electrode branch CE2 and the rest of the light-emitting elements ED.

In each of the first, second, and third subpixels SPX1, SPX2, and SPX3, the first contact electrodes CTE1 may be disposed on the first electrode branches AE2 and may extend in the second direction DR2. In each of the first, second, and third subpixels SPX1, SPX2, and SPX3, the first contact electrodes CTE1 may be in contact with the first end portions of the light-emitting elements ED. In each of the first, second, and third subpixels SPX1, SPX2, and SPX3, the light-emitting elements ED may be connected (e.g., electrically connected) to the first electrode AE through the first contact electrodes CTE1.

In each of the first, second, and third subpixels SPX1, SPX2, and SPX3, the second contact electrode CTE2 may be disposed on the second electrode branch CE2 and may extend in the second direction DR2. In each of the first, second, and third subpixels SPX1, SPX2, and SPX3, the second contact electrode CTE2 may be spaced apart from the first contact electrodes CTE1 in the first direction DR1. In each of the first, second, and third subpixels SPX1, SPX2, and SPX3, the second contact electrode CTE2 may be in contact with the second end portions of the light-emitting elements ED. In each of the first, second, and third subpixels SPX1, SPX2, and SPX3, the light-emitting elements ED may be connected (e.g., electrically connected) to the second electrode CE through the second contact electrode CTE2.

The light-emitting element layer EML may be disposed on the TFT layer TFTL and may include first insulating layers RMPS, second insulating layers NPAS1, and third insulating layers NPAS2.

The first banks BNK1 may be disposed in each of first, second, and third emission areas LA1, LA2, and LA3. In each of the first, second, and third subpixels SPX1, SPX2, and SPX3, each of the first banks BNK1 may overlap the first or second electrode AE or CE. In each of the first, second, and third subpixels SPX1, SPX2, and SPX3, the first and second electrodes AE and CE may be disposed on their respective first banks BNK1. For example, the first banks BNK1 may be disposed on the first planarization layer OC1 and sides of each of the first banks BNK1 may be tilted (or inclined) with respect to the first planarization layer OC1. The inclined sides of each of the first banks BNK1 may reflect light emitted by the light-emitting elements ED of each of the first, second, and third subpixels SPX1, SPX2, and SPX3.

In each of the first, second, and third subpixels SPX1, SPX2, and SPX3, the first electrode stem AE1 may include a first contact hole CNT1, which penetrates the first planarization layer OC1, and may be connected (e.g., electrically connected) to a TFT "TFT" through the first contact hole CNT1.

In each of the first, second, and third subpixels SPX1, SPX2, and SPX3, the second electrode stem CE1 may extend in the first direction DR1 and may be disposed even in a non-emission area where the light-emitting elements ED are not disposed. In each of the first, second, and third subpixels SPX1, SPX2, and SPX3, the second electrode stem CE1 may include a second contact hole CNT2, which penetrates the first planarization layer OC1, may be connected (e.g., electrically connected) to a power supply electrode through the second contact hole CNT2, and may receive a certain electrical signal from the power supply electrode.

The first and second electrodes AE and CE of each of the first, second, and third subpixels SPX1, SPX2, and SPX3 may include a transparent conductive material. The first and second electrodes AE and CE of each of the first, second, and third subpixels SPX1, SPX2, and SPX3 may include a conductive material with high reflectance. The first and second electrodes AE and CE of each of the first, second, and third subpixels SPX1, SPX2, and SPX3 may have a structure in which one or more layers of a transparent conductive material and one or more layers of a metal with high reflectance are stacked or may be formed as single layers including the transparent conductive material and the metal with high reflectance.

The first insulating layers RMPS may be disposed on the first planarization layer OC1 and the first and second electrodes AE and CE of each of the first, second, and third subpixels SPX1, SPX2, and SPX3. The first insulating layers RMPS may cover parts of the first and second electrodes AE and CE of each of the first, second, and third subpixels SPX1, SPX2, and SPX3.

The first insulating layers RMPS may protect and insulate the first and second electrodes AE and CE of each of the first, second, and third subpixels SPX1, SPX2, and SPX3. The first insulating layers RMPS may prevent the light-emitting elements ED of each of the first, second, and third subpixels SPX1, SPX2, and SPX3 from being in contact with, and damaged by, other members.

Referring to FIG. 8, the first insulating layers RMPS may be in contact with (e.g., in direct contact with) parts of the top surface (or upper surface) of the first planarization layer OC1 that are exposed by first and second electrodes AE and CE, the top surfaces of parts of the first and second electrodes AE and CE that are in contact with (e.g., in direct contact with) the first planarization layer OC1, and parts of the first and second electrodes AE and CE on sides of first banks BNK1 and may expose the top surfaces (or upper surfaces) of the parts of the first and second electrodes AE and CE on the sides of the first banks BNK1 and parts of the first and second electrodes AE and CE on the top surfaces (or upper surfaces) of the first banks BNK1. For example, the top surfaces (or upper surfaces) of the parts of the first and second electrodes AE and CE on the sides of the first banks BNK1 and the parts of the first and second electrodes AE and CE on the top surfaces (or upper surfaces) of the first banks BNK1 may be in contact with (e.g., in direct contact with) contact electrodes CTE.

However, the layout of the first insulating layers RMPS are not limited. In another example, the first insulating layers RMPS may cover both the top surfaces (or upper surfaces)

of the parts of the first and second electrodes AE and CE on the sides of the first banks BNK1 and the parts of the first and second electrodes AE and CE on the top surfaces (or upper surfaces) of the first banks BNK1. For example, the first and second electrodes AE and CE may be connected (e.g., electrically connected) to the contact electrodes CTE through separate contact holes.

As illustrated in FIGS. 7 and 8, the display device 10 may further include, in each of the first, second, and third subpixels SPX1, SPX2, and SPX3, auxiliary electrodes FE, which extend in the second direction DR2. The auxiliary electrodes FE may include first auxiliary electrodes FE1, which overlap first electrode branches AE2, and a second auxiliary electrode FE2, which overlaps a second electrode branch CE2. In a plan view, the second auxiliary electrode FE2 may be disposed between the first auxiliary electrodes FE1. Each of the first auxiliary electrodes FE1 may overlap an end portion of a first electrode AE that is in contact with (e.g., in direct contact with) the first planarization layer OC1 and faces a second electrode CE, in the thickness direction, and the second auxiliary electrode FE may overlap an end portion of the second electrode CE that is in direct contact with the first planarization layer OC1 and faces the first electrode AE. For example, end portions of the auxiliary electrodes FE may protrude inwardly beyond end portions of the first and second electrodes AE and CE. The first auxiliary electrodes FE1 and the second auxiliary electrode FE2 may be positioned in the same layer. For example, first auxiliary electrodes FE1 and the second auxiliary electrode FE2 may be disposed on the same layer or may be formed of the same layer or the same material.

The first auxiliary electrodes FE1 and the second auxiliary electrode FE2 may include a transparent conductive material. The transparent conductive material may include amorphous indium tin oxide (ITO), crystalline ITO, amorphous indium zinc oxide (IZO), and crystalline IZO. The first auxiliary electrodes FE1 and the second auxiliary electrode FE2 may have a thickness of about 3 μm to about 30 μm, but embodiments are not limited thereto.

In each of the first, second, and third subpixels SPX1, SPX2, and SPX3, the light-emitting elements ED may be disposed on the first insulating layers RMPS, between the first and second electrodes AE and CE. In each of the first, second, and third subpixels SPX1, SPX2, and SPX3, the first end portions of the light-emitting elements ED may be connected (e.g., electrically connected) to the first electrode AE, and the second end portions of the light-emitting elements ED may be connected (e.g., electrically connected) to the second electrode CE.

In each of the first, second, and third subpixels SPX1, SPX2, and SPX3, each of the auxiliary electrodes FE may overlap the light-emitting elements ED. In each of the first, second, and third subpixels SPX1, SPX2, and SPX3, the first auxiliary electrodes FE1 may overlap the first end portions of the light-emitting elements ED, and the second auxiliary electrode FE2 may overlap the second end portions of the light-emitting elements ED.

In each of the first, second, and third subpixels SPX1, SPX2, and SPX3, parts of the first insulating layers RMPS below the auxiliary electrodes FE may conformally reflect step differences formed by the first and second electrodes AE and CE. Accordingly, in each of the first, second, and third subpixels SPX1, SPX2, and SPX3, the auxiliary electrodes FE may also conformally reflect step differences formed by the first insulating layers RMPS, and as a result, step differences may be formed between parts of the auxiliary electrodes FE that overlap the first and second electrodes AE and CE and parts of the auxiliary electrodes FE that do not overlap the first and second electrodes AE and CE, as illustrated in FIG. 8.

FIG. 8 illustrates that the first end portions of light-emitting elements ED are positioned on part of a first auxiliary electrode FE1 that overlaps a first electrode AE, the second end portions of the light-emitting elements ED are positioned on part of a second auxiliary electrode FE2 that does not overlap a second electrode CE, and as a result, the light-emitting elements ED are tilted (or inclined) at a certain angle with respect to the top surface (or upper surface) of the first planarization layer OC1.

In each of the first, second, and third subpixels SPX1, SPX2, and SPX3, the second insulating layers NPAS1 may be disposed on parts of the light-emitting elements ED, which are disposed between the first and second electrodes AE and CE. In each of the first, second, and third subpixels SPX1, SPX2, and SPX3, the second insulating layers NPAS1 may be disposed on the middle parts of the top surfaces (or upper surfaces) of the light-emitting elements ED. The third insulating layers NPAS2 may surround parts of outer surfaces of the light-emitting elements ED of each of the first, second, and third subpixels SPX1, SPX2, and SPX3. The third insulating layers NPAS2 may protect the light-emitting elements ED of each of the first, second, and third subpixels SPX1, SPX2, and SPX3.

In each of the first, second, and third subpixels SPX1, SPX2, and SPX3, the contact electrodes CTE may be disposed on the light-emitting elements ED and the auxiliary electrodes FE. The contact electrodes CTE of each of the first, second, and third subpixels SPX1, SPX2, and SPX3 may include the first contact electrodes CTE1 and the second contact electrode CTE2. In each of the first, second, and third subpixels SPX1, SPX2, and SPX3, the first contact electrodes CTE1 may cover and may connect (e.g., electrically connect) the first electrode branches AE2 and some of the light-emitting elements ED, and the second contact electrode CTE2 may cover and may connect (e.g., electrically connect) the second electrode branch CE2 and the rest of the light-emitting elements ED.

In each of the first, second, and third subpixels SPX1, SPX2, and SPX3, the first contact electrodes CTE1 may be disposed on the first electrode branches AE2 and may extend in the second direction DR2. In each of the first, second, and third subpixels SPX1, SPX2, and SPX3, the first contact electrodes CTE1 may be in contact with the first end portions of the light-emitting elements ED, and the light-emitting elements ED may be connected (e.g., electrically connected) to the first electrode AE through the first contact electrodes CTE1.

In each of the first, second, and third subpixels SPX1, SPX2, and SPX3, the first contact electrodes CTE1 may be in contact with the top surfaces (or upper surfaces) of end portions of the second insulating layers NPAS1.

The third insulating layers NPAS2 may be disposed on the first contact electrodes CTE1 of each of the first, second, and third subpixels SPX1, SPX2, and SPX3. The third insulating layers NPAS2 may cover (e.g., entirely cover) the first contact electrodes of each of the first, second, and third subpixels SPX1, SPX2, and SPX3 and may be in contact with (e.g., in direct contact with) parts of the second insulating layers NPAS1, exposed by the first contact electrodes CTE1 of each of the first, second, and third subpixels SPX1, SPX2, and SPX3.

In each of the first, second, and third subpixels SPX1, SPX2, and SPX3, the second contact electrode CTE2 may be disposed on the second electrode branch CE2 and may extend in the second direction DR2. In each of the first, second, and third subpixels SPX1, SPX2, and SPX3, the second contact electrode CTE2 may be spaced apart from the first contact electrodes CTE1 in the first direction DR1 and may be in contact with the second end portions of the light-emitting elements ED, and the light-emitting elements ED may be connected (e.g., electrically connected) to the second electrode CE through the second contact electrode CTE2.

In each of the first, second, and third subpixels SPX1, SPX2, and SPX3, the second contact electrode CTE2 may be in contact with (e.g., in direct contact with) sides of the second insulating layers NPAS1 and the top surfaces (or upper surfaces) of the third insulating layers NPAS2.

The first contact electrodes CTE1 and the second contact electrode CTE2 of each of the first, second, and third subpixels SPX1, SPX2, and SPX3 may not be positioned in the same layer. In some embodiments, the first contact electrodes CTE1 and the second contact electrode CTE2 of each of the first, second, and third subpixels SPX1, SPX2, and SPX3 may be positioned in the same layer to expose the middle parts of the top surfaces (or upper surfaces) of the second insulating layers NPAS1, and the third insulating layers NPAS2 may not be provided.

Figure 10:
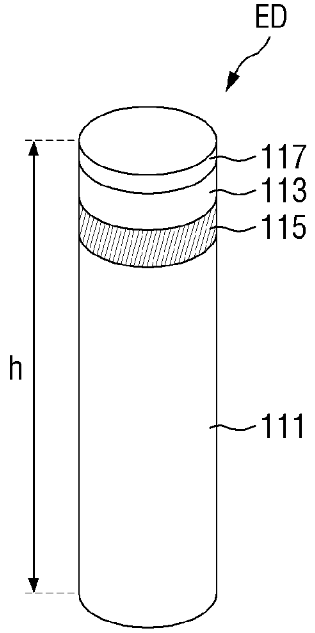
FIG. 10 is a schematic perspective view of a light-emitting element according to an embodiment.

FIG. 10 is a schematic perspective view of a light-emitting element according to an embodiment.

Referring to FIGS. 9 and 10, a light-emitting element ED may be a light-emitting diode (LED). For example, the light-emitting element ED may be an inorganic LED having a size of several micrometers or nanometers or including an inorganic material. The inorganic LED may be aligned between opposing electrodes in accordance with an electric field formed between the opposing electrodes in a particular direction The light-emitting element ED may extend in a direction. The light-emitting element ED may have a rod shape, a wire shape, or a tube shape. The light-emitting element ED may include a first semiconductor layer 111, a second semiconductor layer 113, an active layer 115, and an electrode layer 117.

The first semiconductor layer 111 may be an n-type semiconductor. The second semiconductor layer 113 may be disposed on the active layer 115. The first and second semiconductor layers 111 and 113 may be formed as single layers, but embodiments are not limited thereto.

The active layer 115 may be disposed between the first and second semiconductor layers 111 and 113. The active layer 115 may include a material having a single-quantum well structure or a multi-quantum well structure. In a case where the active layer 115 includes a material having the multi-quantum well structure, quantum layers and well layers may be alternately stacked in the active layer 115.

Light may be emitted by the active layer 115 in the lengthwise direction of the light-emitting element ED and even through the side of the light-emitting element ED. The direction in which light is emitted by the active layer 115 is not limited.

The electrode layer 117 may be an ohmic contact electrode. In another example, the electrode layer 117 may be a Schottky contact electrode. The light-emitting element ED may include at least one electrode layer 117.

The insulating layer 118 may surround the outer surfaces of the first and second semiconductor layers 111 and 113 and the electrode layer 117. The insulating layer 118 may also surround the outer surface of the active layer 115 and may extend in the direction in which the light-emitting element ED extends. The insulating layer 118 may protect the light-emitting element ED.

Referring again to FIGS. 8 and 9, at least parts of the first and second electrodes AE and CE may generate an electric field in, for example, the first subpixel SPX1, ink including the light-emitting elements ED may be jetted (or sprayed) between the first and second electrodes AE and CE, and the light-emitting elements ED dispersed in the ink may be aligned and placed between the first and second electrodes AE and CE by the electric field. However, in case that the light-emitting elements ED dispersed in the ink are jetted (or sprayed) too close to one of the first and second electrodes AE and CE, an eccentricity defect (or a misalignment defect) may occur in which the light-emitting elements ED are disposed too close to one of the first and second electrodes AE and CE. In case that a left eccentricity defect (or a left shifting misalignment defect) occurs in which the light-emitting elements ED are disposed closer to the first electrode AE than to the second electrode CE, the first end portions of the light-emitting elements ED may be disposed on a first insulating layer RMPS overlapping the first electrode AE to be tilted (or inclined) with respect to the top surface (or upper surface) of the first planarization layer OC1, and as a result, a first contact electrode CTE1 may be electrically opened (or disconnected from the light-emitting elements ED) in a sequential process. Only the left eccentricity defect has been described so far, but a right eccentricity defect (or a left shifting misalignment defect) may also occur in which the light-emitting elements ED are disposed closer to the second electrode CE than to the first electrode AE, in which case, a second contact electrode CTE2 may be electrically opened in a sequential process.

In some embodiments, during the fabrication of the light-emitting element ED of FIG. 10, protrusions (from, for example, the electrode layer 117 or the first semiconductor layer 111) may be formed on the light-emitting element ED. For example, the contact electrodes CTE may also be electrically opened (or disconnected from the light-emitting elements ED) in a sequential process.

As the first auxiliary electrodes FE1 and the second auxiliary electrode FE2, which overlap the first end portions and the second end portions of the light-emitting elements ED, are additionally disposed between the contact electrodes CTE and the first and second electrodes AE and CE, the first auxiliary electrodes FE1 are connected (e.g., electrically connected) to the first contact electrodes CTE1, and the second auxiliary electrode FE2 is connected (e.g., electrically connected) to the second contact electrode CTE2, the first auxiliary electrodes FE1 may be connected (e.g., electrically connected) to electrode layers 117 or second semiconductor layers 113 of the light-emitting elements ED, and the second auxiliary electrode FE2 may be connected (e.g., electrically connected) to first semiconductor layers 111 of the light-emitting elements ED. Accordingly, in case that the contact electrodes CTE are electrically opened due to any eccentricity defect (or any misalignment defect) associated with the light-emitting elements ED and/or the presence of protrusions on the light-emitting elements ED, the light-emitting elements ED may still be able to be connected (e.g., electrically connected) to the contact electrodes CTE.

Referring again to FIGS. 9 and 10, the light-emitting element ED may further include the insulating layer 118. The insulating layer 118 may surround the outer surfaces of the first and second semiconductor layers 111 and 113 and the electrode layer 117. The insulating layer 118 may also surround the outer surface of the active layer 115 and may extend in the direction in which the light-emitting element ED extends. The insulating layer 118 may protect the light-emitting element ED.

The insulating layer 118 may include a material having an insulating property, e.g., silicon oxide ($SiO_x$), silicon nitride ($SiN_x$), silicon oxynitride ($SiO_xN_y$), aluminum nitride (AlN), or aluminum oxide ($Al_2O_3$).

As the insulating layer 118 of the light-emitting element ED is in contact with an auxiliary electrode FE, the auxiliary electrode FE may not be in contact with the electrode layer 117 or the first and second semiconductor layers 111 and 113 of the light-emitting element ED. For example, however, as the auxiliary electrode FE is connected (e.g., electrically connected) to a contact electrode CTE, the resistance of the contact electrode CTE may be lowered.

Display devices according to other embodiments will hereinafter be described.

Figure 11:
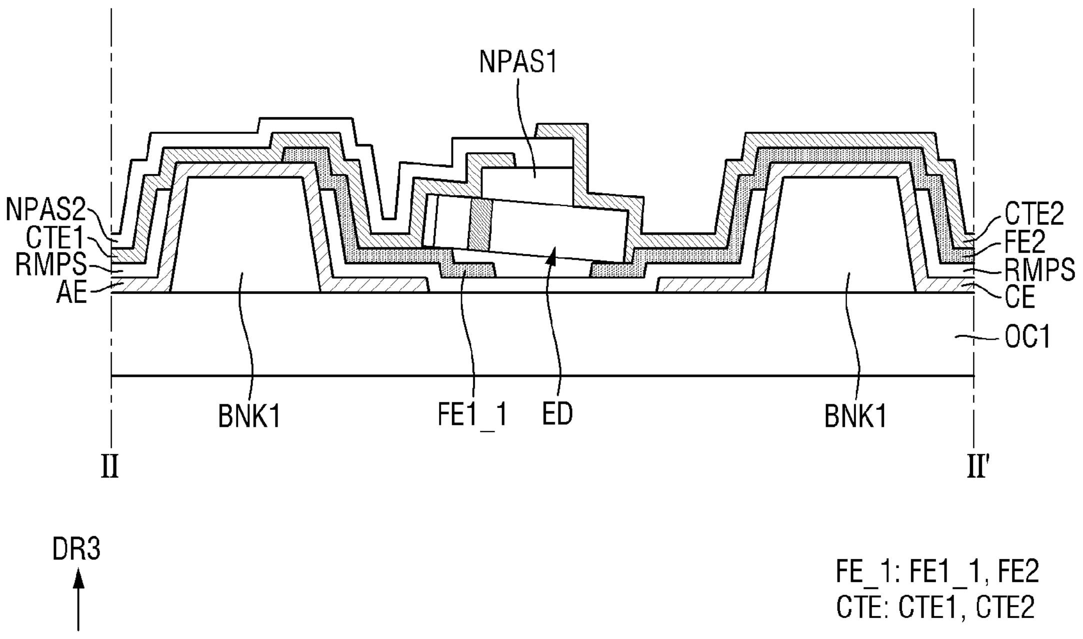
FIG. 11 is a schematic cross-sectional view of a display device according to another embodiment.

FIG. 11 is a schematic cross-sectional view of a display device according to another embodiment.

Referring to FIG. 11, auxiliary electrodes FE_1 differ from their counterpart of FIG. 8 in that a first auxiliary electrode FE1_1 further extends along inner sides (e.g., facing inner sides) of first banks BNK1 and the top surfaces (or upper surfaces) of the first banks BNK1.

Other features of the display device of FIG. 11 are as already described above with reference to FIG. 8, and thus, redundant descriptions thereof will be omitted for descriptive convenience.

Figure 12:
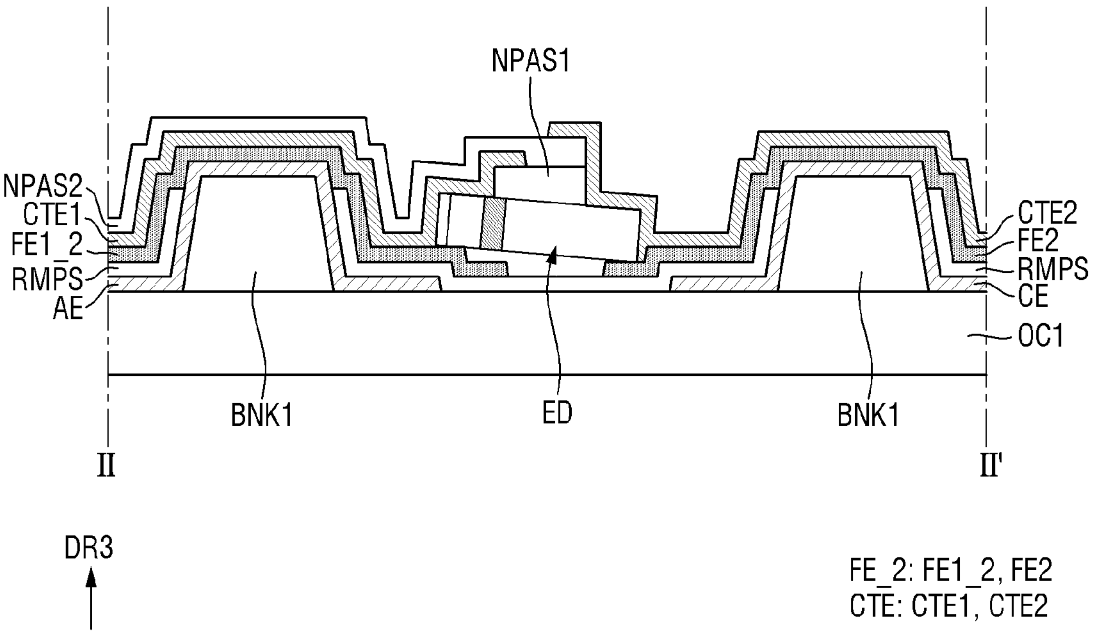
FIG. 12 is a schematic cross-sectional view of a display device according to another embodiment.

FIG. 12 is a schematic cross-sectional view of a display device according to another embodiment.

Referring to FIG. 12, auxiliary electrodes FE_2 differ from their counterpart of FIG. 11 in that a first auxiliary electrode FE1_1 further extends along outer sides (e.g., opposite outer sides) of first banks BNK1.

Other features of the display device of FIG. 12 are as already described above with reference to FIG. 11, and thus, redundant descriptions thereof will be omitted for descriptive convenience.

Figure 13:
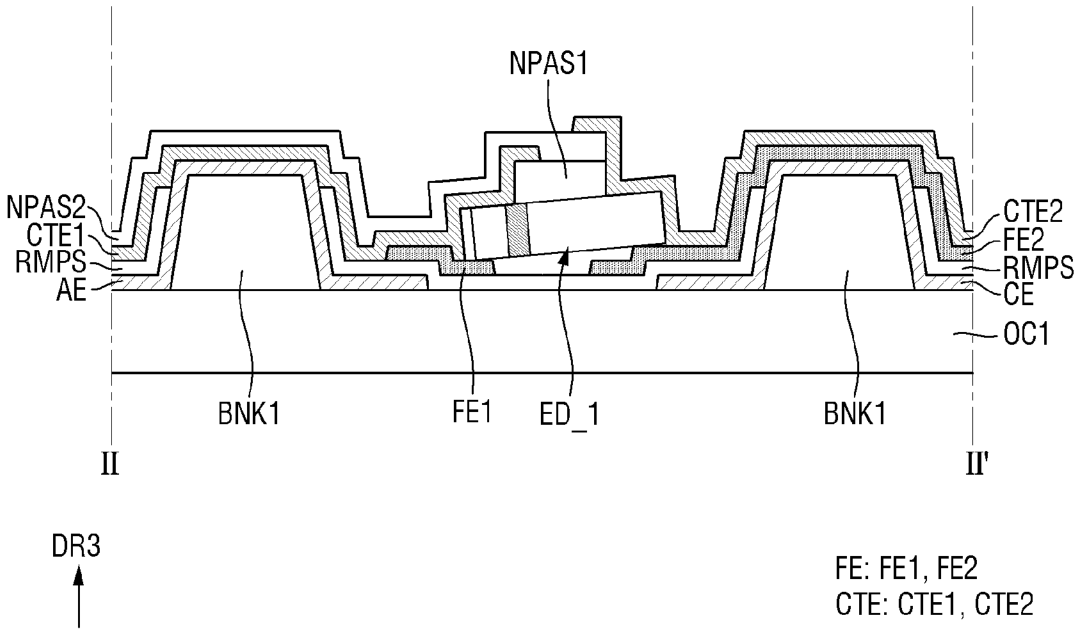
FIG. 13 is a schematic cross-sectional view of a display device according to another embodiment.

FIG. 13 is a schematic cross-sectional view of a display device according to another embodiment.

Referring to FIG. 13, second end portions of light-emitting elements ED may be positioned on part of a second auxiliary electrode FE2 that overlaps a second electrode CE, and first end portions of the light-emitting elements ED may be positioned on part of a first auxiliary electrode FE1 that does not overlap a first electrode AE. Accordingly, the light-emitting elements ED may be tilted (or inclined) at a certain angle with respect to the top surface (or upper surface) of a first planarization layer OC1.

Other features of the display device of FIG. 13 are as already described above with reference to FIG. 8, and thus, redundant descriptions thereof will be omitted for descriptive convenience.

Figure 14:
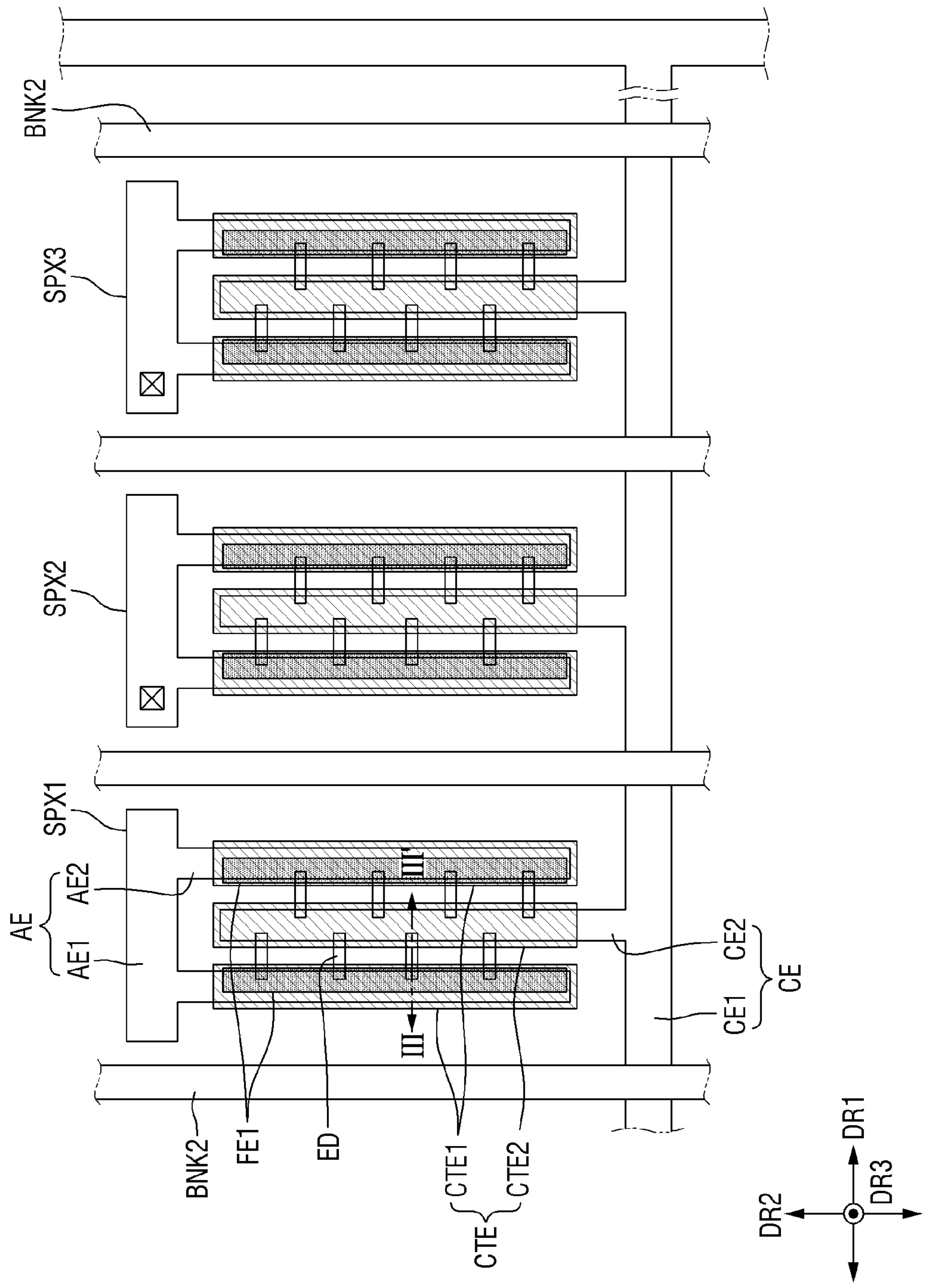
FIG. 14 is a schematic plan view of a pixel of a display device according to another embodiment.
Figure 15:
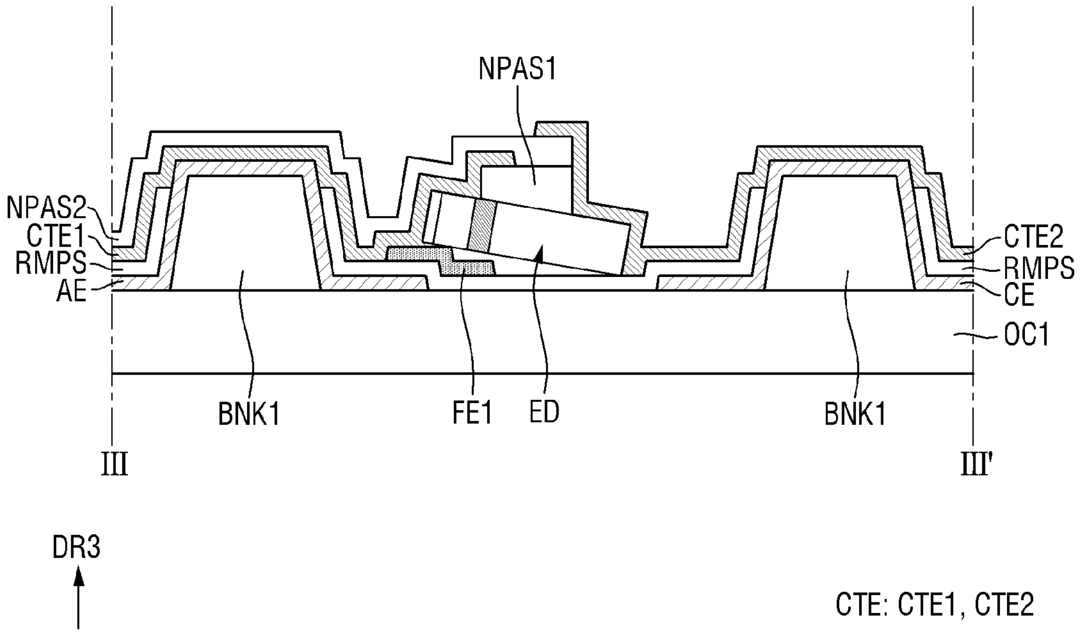
FIG. 15 is a schematic cross-sectional view taken along line of FIG. 14.

FIG. 14 is a schematic plan view of a pixel of a display device according to another embodiment. FIG. 15 is a schematic cross-sectional view taken along line of FIG. 14.

Referring to FIGS. 14 and 15, the display device of FIGS. 14 and 15 differs from its counterpart of FIGS. 7 and 8 in that it does not include a second auxiliary electrode FE2.

For example, the display device of FIGS. 14 and 15 may not include a second auxiliary electrode FE2.

Other features of the display device of FIGS. 14 and 15 are as already described above with reference to FIGS. 7 and 8, and thus, redundant descriptions thereof will be omitted for descriptive convenience.

Figure 16:
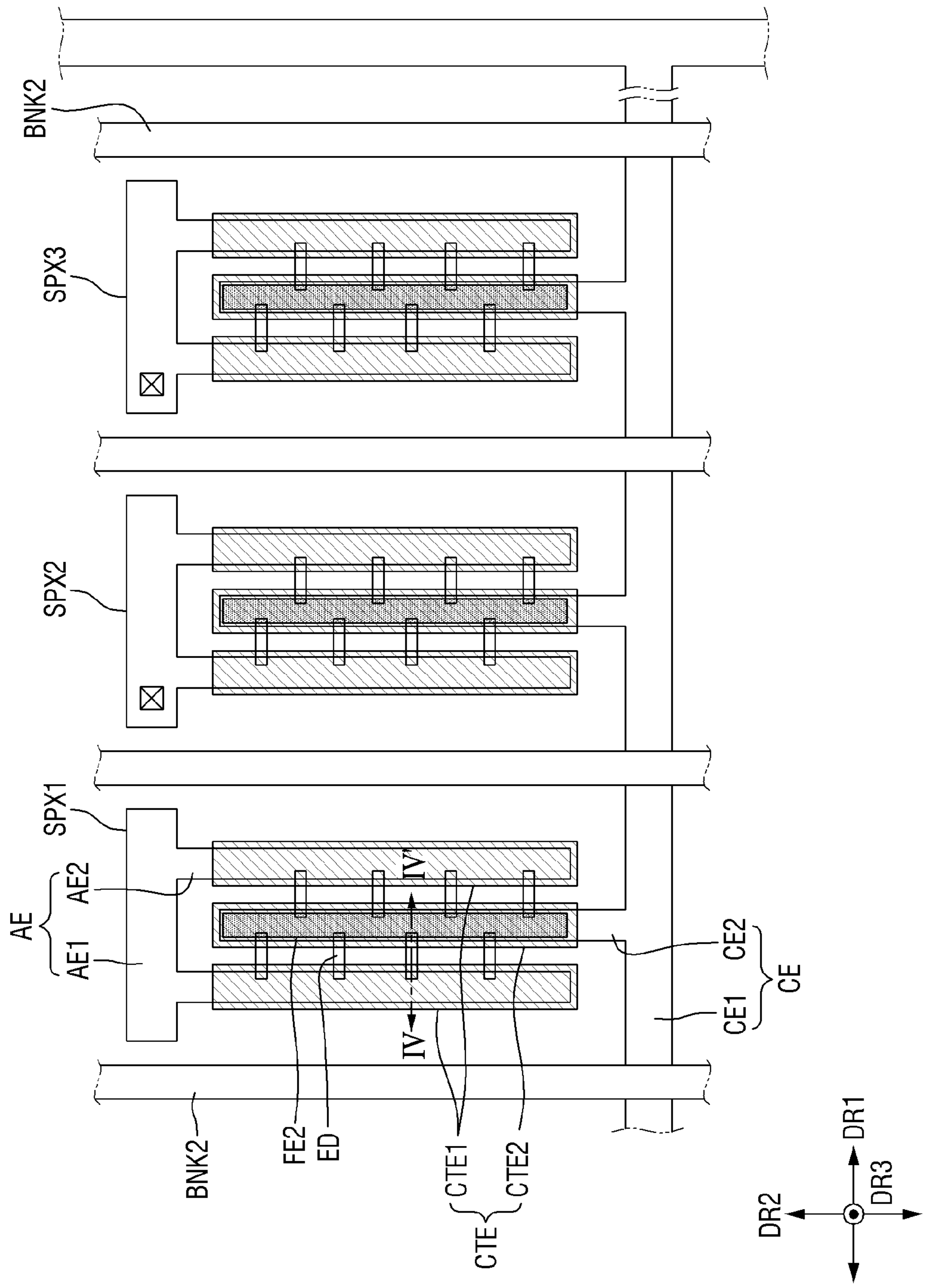
FIG. 16 is a schematic plan view of a pixel of a display device according to another embodiment.
Figure 17:
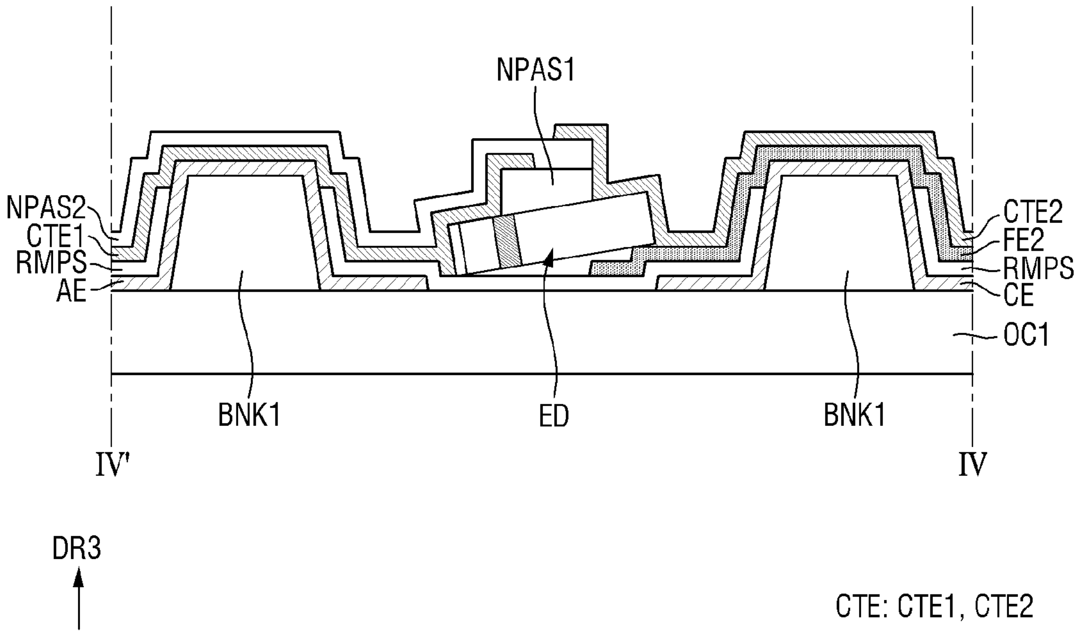
FIG. 17 is a schematic cross-sectional view taken along line IV-IV' of FIG. 16.

FIG. 16 is a schematic plan view of a pixel of a display device according to another embodiment. FIG. 17 is a schematic cross-sectional view taken along line IV-IV' of FIG. 16.

Referring to FIGS. 16 and 17, the display device of FIGS. 16 and 17 differs from its counterpart of FIGS. 7 and 8 in that it does not include first auxiliary electrodes FE1.

For example, the display device of FIGS. 16 and 17 may not include first auxiliary electrodes FE1.

Other features of the display device of FIGS. 16 and 17 are as already described above with reference to FIGS. 7 and 8, and thus, redundant descriptions thereof will be omitted for descriptive convenience.

Figure 18:
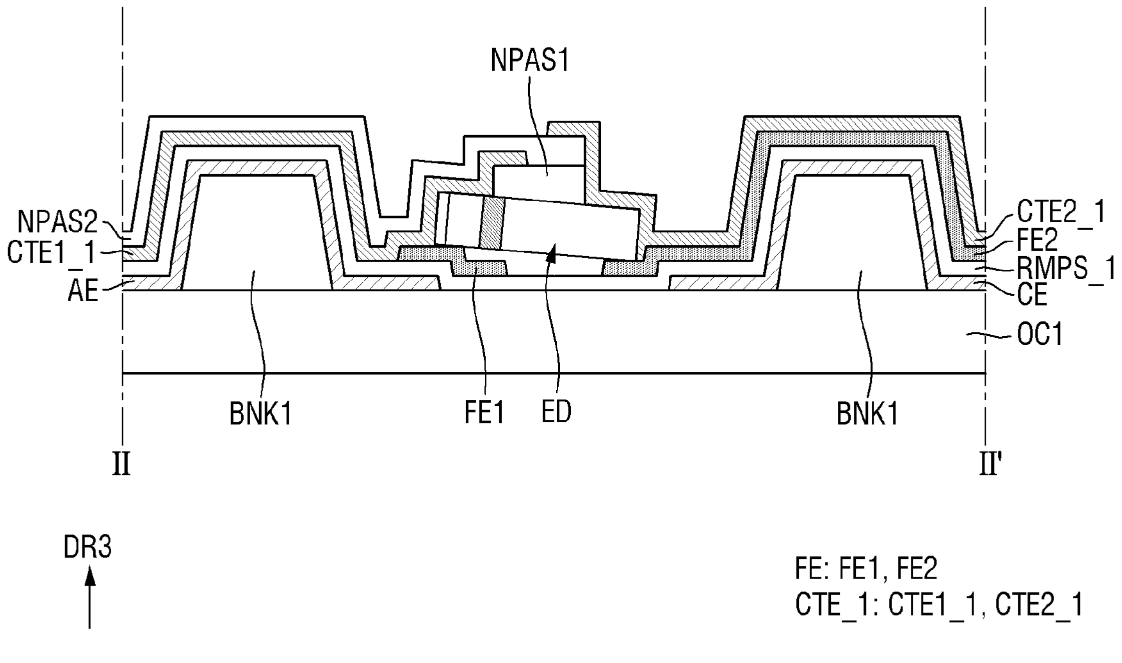
FIG. 18 is a schematic cross-sectional view of a display device according to another embodiment.

FIG. 18 is a schematic cross-sectional view of a display device according to another embodiment.

Referring to FIG. 18, the display device of FIG. 18 differs from its counterpart of FIG. 8 in that first insulating layers RMPS_1 do not expose, but cover the top surfaces (or upper surfaces) of parts of the first and second electrodes AE and CE on sides of first banks BNK1 and parts of the first and second electrodes AE and CE on the top surfaces (or upper surfaces) of the first banks BNK1.

For example, as the first insulating layers RMPS_1 cover the top surfaces (or upper surfaces) of the parts of the first and second electrodes AE and CE on the sides of first banks BNK1 and parts of the first and second electrodes AE and CE on the top surfaces (or upper surfaces) of the first banks BNK1, contact electrodes CTE_1 may be spaced apart from the first and second electrodes AE and CE by the first insulating layers RMPS_1, on the sides of first banks BNK1 and on the top surfaces (or upper surfaces) of the first banks BNK1. For example, the contact electrodes CTE_1 may be in contact with the first and second electrodes AE and CE, in other areas than areas on the sides of first banks BNK1 and on the top surfaces (or upper surfaces) of the first banks BNK1, for example, in a non-display area ("NDA" of FIG. 1), but embodiments are not limited thereto.

Other features of the display device of FIG. 18 are as already described above with reference to FIG. 8, and thus, redundant descriptions thereof will be omitted for descriptive convenience.

Figure 19:
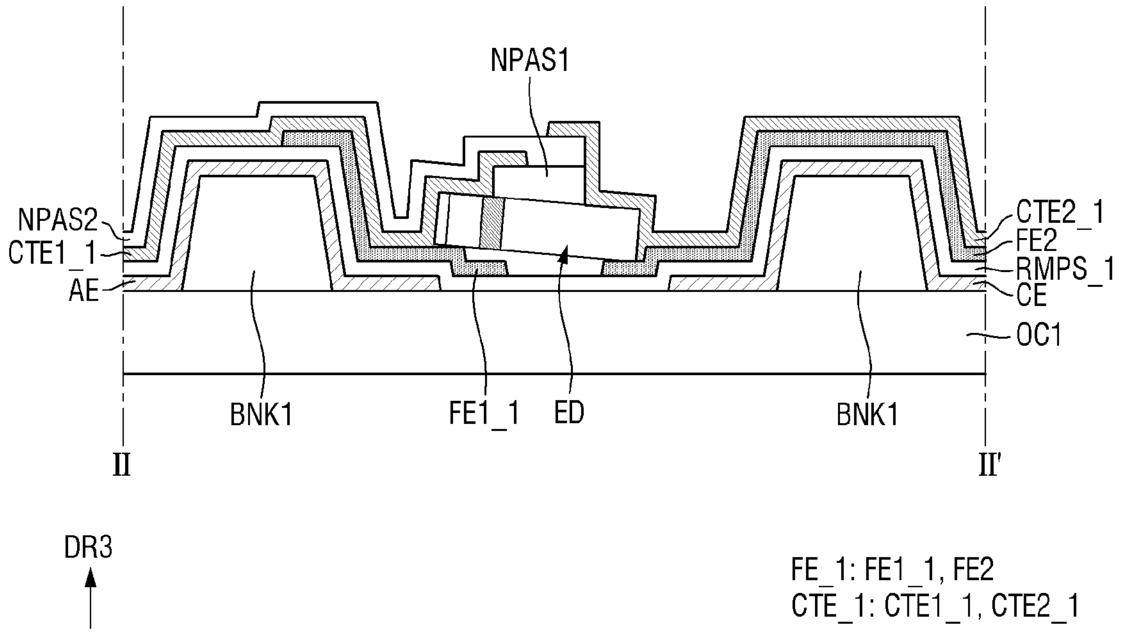
FIG. 19 is a schematic cross-sectional view of a display device according to another embodiment.

FIG. 19 is a schematic cross-sectional view of a display device according to another embodiment.

Referring to FIG. 19, the display device of FIG. 19 differs from its counterpart of FIG. 11 in that first insulating layers RMPS_1 do not expose, but cover the top surfaces (or upper surfaces) of parts of the first and second electrodes AE and CE on sides of first banks BNK1 and parts of the first and second electrodes AE and CE on the top surfaces (or upper surfaces) of the first banks BNK1.

For example, as the first insulating layers RMPS_1 cover the top surfaces (or upper surfaces) of the parts of the first and second electrodes AE and CE on the sides of first banks BNK1 and parts of the first and second electrodes AE and CE on the top surfaces (or upper surfaces) of the first banks BNK1, contact electrodes CTE_1 may be spaced apart from the first and second electrodes AE and CE by the first insulating layers RMPS_1, on the sides of first banks BNK1 and on the top surfaces (or upper surfaces) of the first banks BNK1. For example, the contact electrodes CTE_1 may be in contact with the first and second electrodes AE and CE, in other areas than areas on the sides of first banks BNK1 and on the top surfaces (or upper surfaces) of the first banks BNK1, for example, in a non-display area ("NDA" of FIG. 1), but embodiments are not limited thereto.

Other features of the display device of FIG. 19 are as already described above with reference to FIG. 11, and thus, redundant descriptions thereof will be omitted for descriptive convenience.

Figure 20:
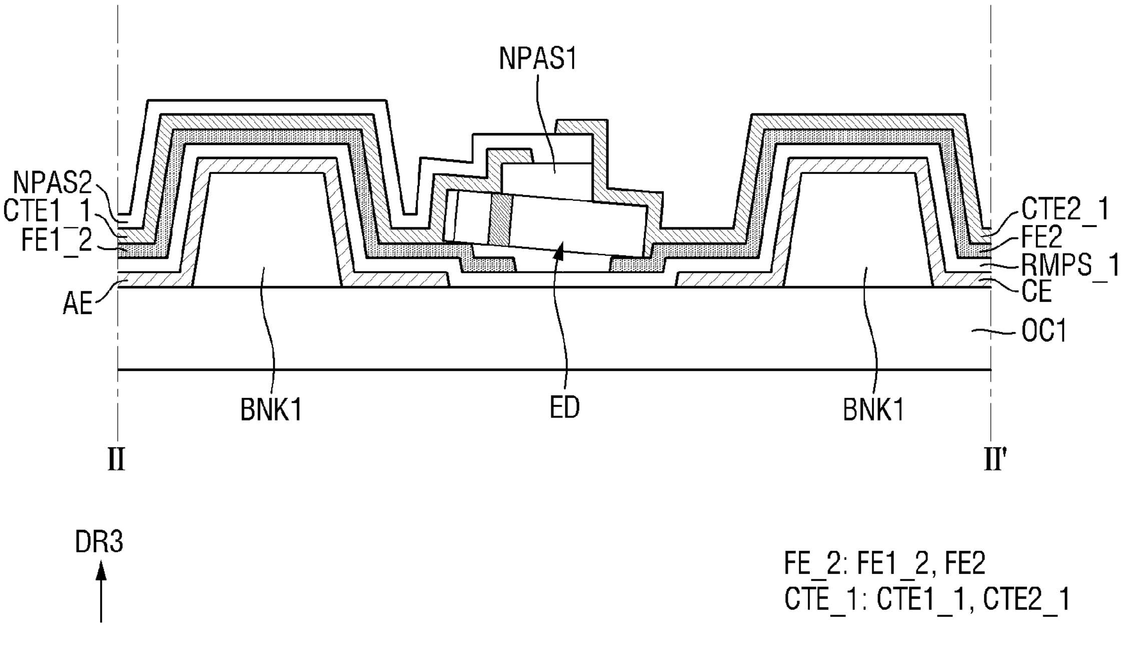
FIG. 20 is a schematic cross-sectional view of a display device according to another embodiment.

FIG. 20 is a schematic cross-sectional view of a display device according to another embodiment.

Referring to FIG. 20, the display device of FIG. 20 differs from its counterpart of FIG. 12 in that first insulating layers RMPS_1 do not expose, but cover the top surfaces (or upper surfaces) of parts of the first and second electrodes AE and CE on sides of first banks BNK1 and parts of the first and second electrodes AE and CE on the top surfaces (or upper surfaces) of the first banks BNK1.

For example, as the first insulating layers RMPS_1 cover the top surfaces (or upper surfaces) of the parts of the first and second electrodes AE and CE on the sides of first banks BNK1 and parts of the first and second electrodes AE and CE on the top surfaces (or upper surfaces) of the first banks BNK1, contact electrodes CTE_1 may be spaced apart from the first and second electrodes AE and CE by the first insulating layers RMPS_1, on the sides of first banks BNK1 and on the top surfaces (or upper surfaces) of the first banks BNK1. For example, the contact electrodes CTE_1 may be in contact with the first and second electrodes AE and CE, in other areas than areas on the sides of first banks BNK1 and on the top surfaces (or upper surfaces) of the first banks BNK1, for example, in a non-display area ("NDA" of FIG. 1), but embodiments are not limited thereto.

Other features of the display device of FIG. 20 are as already described above with reference to FIG. 12, and thus, redundant descriptions thereof will be omitted for descriptive convenience.

Figure 21:
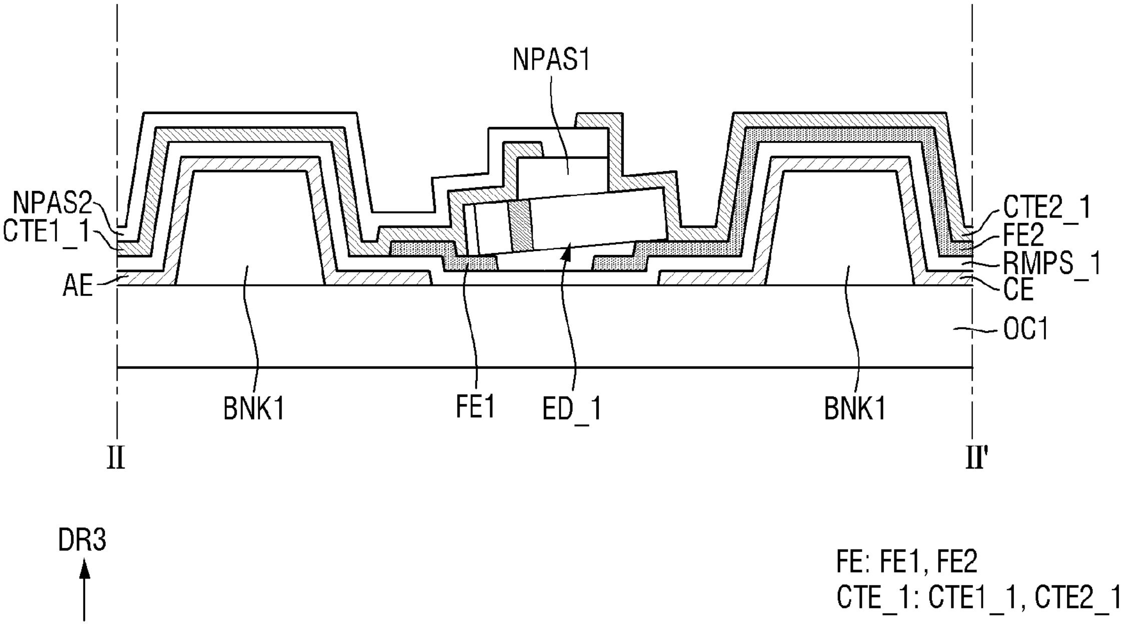
FIG. 21 is a schematic cross-sectional view of a display device according to another embodiment.

FIG. 21 is a schematic cross-sectional view of a display device according to another embodiment.

Referring to FIG. 21, the display device of FIG. 21 differs from its counterpart of FIG. 13 in that first insulating layers RMPS_1 do not expose, but cover the top surfaces (or upper surfaces) of parts of the first and second electrodes AE and CE on sides of first banks BNK1 and parts of the first and second electrodes AE and CE on the top surfaces (or upper surfaces) of the first banks BNK1.

For example, as the first insulating layers RMPS_1 cover the top surfaces (or upper surfaces) of the parts of the first and second electrodes AE and CE on the sides of first banks BNK1 and parts of the first and second electrodes AE and CE on the top surfaces (or upper surfaces) of the first banks BNK1, contact electrodes CTE_1 may be spaced apart from the first and second electrodes AE and CE by the first insulating layers RMPS_1, on the sides of first banks BNK1 and on the top surfaces (or upper surfaces) of the first banks BNK1. For example, the contact electrodes CTE_1 may be in contact with the first and second electrodes AE and CE, in other areas than areas on the sides of first banks BNK1 and on the top surfaces (or upper surfaces) of the first banks BNK1, for example, in a non-display area ("NDA" of FIG. 1), but embodiments are not limited thereto.

Other features of the display device of FIG. 21 are as already described above with reference to FIG. 13, and thus, redundant descriptions thereof will be omitted for descriptive convenience.

Figure 22:
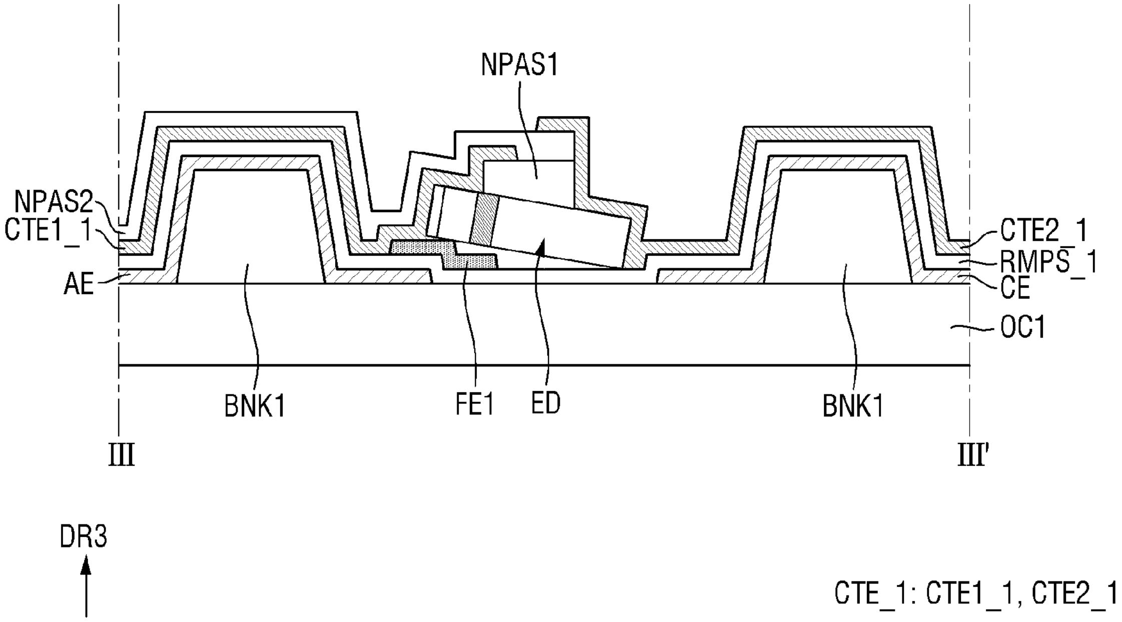
FIG. 22 is a schematic cross-sectional view of a display device according to another embodiment.

FIG. 22 is a schematic cross-sectional view of a display device according to another embodiment.

Referring to FIG. 22, the display device of FIG. 22 differs from its counterpart of FIG. 15 in that first insulating layers RMPS_1 do not expose, but cover the top surfaces (or upper surfaces) of parts of the first and second electrodes AE and CE on sides of first banks BNK1 and parts of the first and second electrodes AE and CE on the top surfaces (or upper surfaces) of the first banks BNK1.

For example, as the first insulating layers RMPS_1 cover the top surfaces (or upper surfaces) of the parts of the first and second electrodes AE and CE on the sides of first banks BNK1 and parts of the first and second electrodes AE and CE on the top surfaces (or upper surfaces) of the first banks BNK1, contact electrodes CTE_1 may be spaced apart from the first and second electrodes AE and CE by the first insulating layers RMPS_1, on the sides of first banks BNK1 and on the top surfaces (or upper surfaces) of the first banks BNK1. For example, the contact electrodes CTE_1 may be in contact with the first and second electrodes AE and CE, in other areas than areas on the sides of first banks BNK1 and on the top surfaces (or upper surfaces) of the first banks BNK1, for example, in a non-display area ("NDA" of FIG. 1), but embodiments are not limited thereto.

Other features of the display device of FIG. 22 are as already described above with reference to FIG. 15, and thus, redundant descriptions thereof will be omitted for descriptive convenience.

Figure 23:
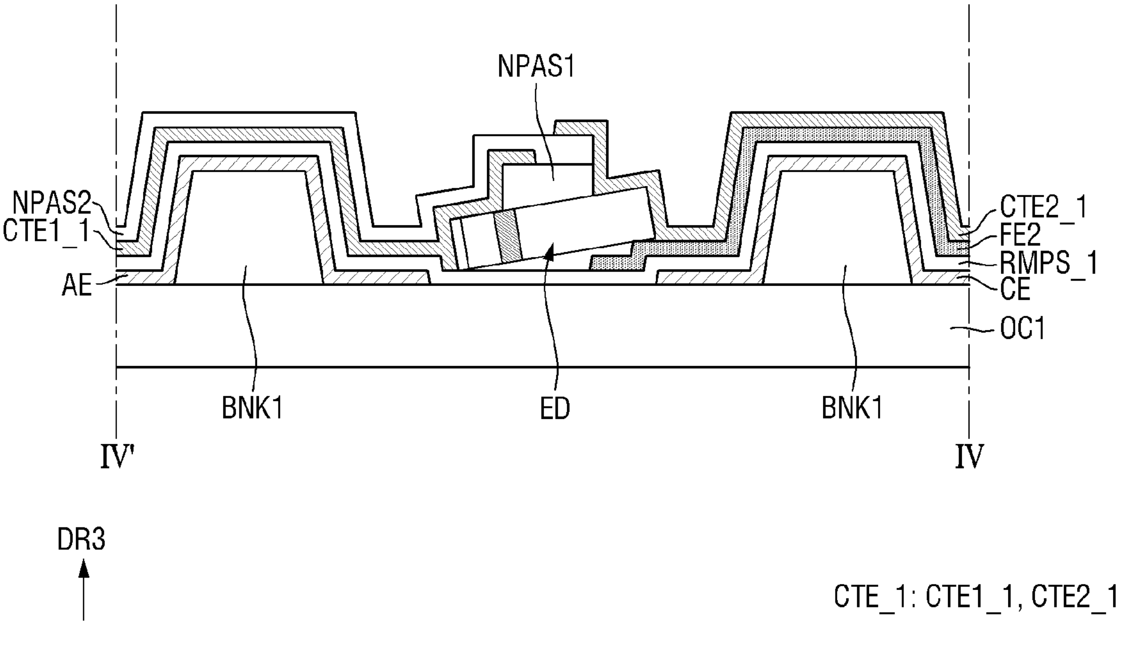
FIG. 23 is a schematic cross-sectional view of a display device according to another embodiment.

FIG. 23 is a schematic cross-sectional view of a display device according to another embodiment.

Referring to FIG. 23, the display device of FIG. 23 differs from its counterpart of FIG. 17 in that first insulating layers RMPS_1 do not expose, but cover the top surfaces (or upper surfaces) of parts of the first and second electrodes AE and CE on sides of first banks BNK1 and parts of the first and second electrodes AE and CE on the top surfaces (or upper surfaces) of the first banks BNK1.

For example, as the first insulating layers RMPS_1 cover the top surfaces (or upper surfaces) of the parts of the first and second electrodes AE and CE on the sides of first banks BNK1 and parts of the first and second electrodes AE and CE on the top surfaces (or upper surfaces) of the first banks BNK1, contact electrodes CTE_1 may be spaced apart from the first and second electrodes AE and CE by the first insulating layers RMPS_1, on the sides of first banks BNK1 and on the top surfaces (or upper surfaces) of the first banks BNK1. For example, the contact electrodes CTE_1 may be in contact with the first and second electrodes AE and CE, in other areas than areas on the sides of first banks BNK1 and on the top surfaces (or upper surfaces) of the first banks BNK1, for example, in a non-display area ("NDA" of FIG. 1), but embodiments are not limited thereto.

Other features of the display device of FIG. 23 are as already described above with reference to FIG. 17, and thus, redundant descriptions thereof will be omitted for descriptive convenience.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display device comprising:

a substrate;

first banks disposed on the substrate and spaced apart from each other;

first and second electrodes disposed on the first banks to cover the first banks and spaced apart from each other;

first contact electrodes connected to the first electrode and in contact with first end portions of the light-emitting elements;

first auxiliary electrodes on the first electrode; and light-emitting elements disposed between the first and second electrodes, wherein the first auxiliary electrodes overlap the light-emitting elements.

2. The display device of claim 1, wherein the first auxiliary electrodes overlap end portions of the first electrode.

3. The display device of claim 2, further comprising:

a second auxiliary electrode on the second electrode, wherein the second auxiliary electrode overlaps the light-emitting elements and an end portion of the second electrode.

4. The display device of claim 3, wherein the first and second auxiliary electrodes are disposed on a same layer.

5. The display device of claim 4, wherein the first auxiliary electrodes and the second auxiliary electrode include a transparent conductive material.

6. The display device of claim 5, wherein the transparent conductive material includes amorphous indium tin oxide (ITO), crystalline ITO, amorphous indium zinc oxide (IZO), and crystalline IZO.

7. The display device of claim 3, wherein the first auxiliary electrodes and the second auxiliary electrode have a thickness of about 3 μm to about 30 μm.

8. The display device of claim 3, further comprising:

first insulating layers disposed between the first electrode and the first auxiliary electrodes and between the second electrode and the second auxiliary electrode.

9. The display device of claim 1, further comprising:

a second contact electrode connected to the second electrode and in contact with second end portions of the light-emitting elements.

10. The display device of claim 9, wherein the first contact electrodes are in direct contact with the first auxiliary electrodes.

11. The display device of claim 10, wherein the second contact electrode is in direct contact with the second auxiliary electrode.

12. The display device of claim 11, wherein the first auxiliary electrodes and the second auxiliary electrode are in direct contact with the light-emitting elements.

13. The display device of claim 12, further comprising:

second insulating layers disposed on upper surfaces of the light-emitting elements, wherein the first contact electrodes are in direct contact with upper surfaces of the second insulating layers.

14. The display device of claim 13, further comprising:

third insulating layers disposed on the first contact electrodes, wherein the third insulating layers are in direct contact with end portions of the first contact electrodes and the upper surfaces of the second insulating layers.

15. The display device of claim 14, wherein the second contact electrode is in direct contact with upper surfaces of the third insulating layers.

16. A display device comprising:

a substrate;

first banks disposed on the substrate and spaced apart from each other;

first and second electrodes disposed on the first banks to cover the first banks and spaced apart from each other in a first direction, the first and second electrodes extending in a second direction intersecting the first direction;

first auxiliary electrodes extending in the second direction on the first electrode; and light-emitting elements disposed between the first and second electrodes;

first contact electrodes connected to the first electrode, the first contact electrodes extending in the second direction and being in contact with first end portions of the light-emitting elements; and a second contact electrode connected to the second electrode, the second contact electrode extending in the second direction and being in contact with second end portions of the light-emitting elements, wherein the first auxiliary electrodes overlap the first end portions of the light-emitting elements.

17. The display device of claim 16, wherein the first auxiliary electrodes overlap end portions of the first electrode in a plan view, and the first contact electrodes overlap end portions of the first auxiliary electrodes in a plan view.

18. The display device of claim 17, further comprising:

a second auxiliary electrode extending in the second direction between the second electrode and the second contact electrode.

19. The display device of claim 18, wherein the second auxiliary electrode overlaps an end portion of the second electrode in a plan view, and the second contact electrode overlaps an end portion of the second auxiliary electrode in a plan view.

20. An electronic device comprising:

a substrate;

first banks disposed on the substrate and spaced apart from each other;

first and second electrodes disposed on the first banks to cover the first banks and spaced apart from each other;

first contact electrodes connected to the first electrode and in contact with first end portions of the light-emitting elements;

first auxiliary electrodes on the first electrode; and light-emitting elements disposed between the first and second electrodes, wherein the first auxiliary electrodes overlap the light-emitting elements.

* * * * *